(12) United States Patent
Mandelman et al.

(10) Patent No.: US 6,734,056 B2
(45) Date of Patent: May 11, 2004

(54) SELF-ALIGNED PUNCH THROUGH STOP FOR $6F^2$ ROTATED HYBRID DRAM CELL

(75) Inventors: Jack A. Mandelman, Stormville, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/341,831

(22) Filed: Jan. 14, 2003

(65) Prior Publication Data

US 2003/0155609 A1 Aug. 21, 2003

Related U.S. Application Data

(62) Division of application No. 10/078,926, filed on Feb. 20, 2002, now Pat. No. 6,534,824.

(51) Int. Cl.$^7$ ............................................. H01L 21/8238
(52) U.S. Cl. ........................ 438/212; 438/268; 438/270
(58) Field of Search ................................. 438/212, 242, 438/248, 259, 268, 270, 282, 283, 587, 589

(56) References Cited

U.S. PATENT DOCUMENTS

| | | |
|---|---|---|
| 5,021,845 A | 6/1991 | Hashimoto |
| 5,234,856 A | 8/1993 | Gonzalez |
| 5,439,835 A | 8/1995 | Gonzalez |
| 5,867,420 A | 2/1999 | Alsmeier |
| 5,893,735 A | 4/1999 | Stengl et al. |
| 6,025,224 A | 2/2000 | Gall et al. |
| 6,034,390 A | 3/2000 | Tews |
| 6,100,131 A | 8/2000 | Alsmeier |
| 6,163,045 A | 12/2000 | Mandelman et al. |
| 6,200,873 B1 | 3/2001 | Schrems et al. |
| 6,265,741 B1 | 7/2001 | Schrems |
| 6,297,086 B1 * | 10/2001 | Hegde et al. ............... 438/243 |
| 6,339,241 B1 * | 1/2002 | Mandelman et al. ........ 257/301 |
| 6,373,091 B2 | 4/2002 | Horak et al. |

FOREIGN PATENT DOCUMENTS

JP          60175447          9/1985

OTHER PUBLICATIONS

M.S. Dittrich, et al., "Bipolar/CMOS Sram Cell", IBM Technical Disclosure Bulletin, vol. 31, No. 8, Jan. 1989, pp. 385–387.

* cited by examiner

*Primary Examiner*—Phat X. Cao
*Assistant Examiner*—Theresa T. Doan
(74) *Attorney, Agent, or Firm*—Scully, Scott, Murphy & Presser; Joseph P. Abate, Esq.

(57) ABSTRACT

A $6F^2$ memory cell structure and a method of fabricating the same. The memory cell structure includes a plurality of memory cells located in a Si-containing substrate which are arranged in rows and columns. Each memory cell includes a double-gated vertical MOSFET having exposed gate conductor regions and two gates formed on opposing sidewalls of the MOSFETs. The memory cell structure also includes a plurality of wordlines overlaying the double-gated vertical MOSFETs and in contact with the exposed gate conductor regions, and a plurality of bitlines that are orthogonal to the wordlines. Trench isolation regions are located adjacent to the rows of memory cells. The memory cell structure also includes a plurality of punch through stop regions located in the Si-containing substrate and self-aligned to the wordlines and bitlines. A portion of the punch through stop regions overlap each other under the bitlines and each region serves to electrically isolate adjacent buried-strap regions from each other.

10 Claims, 21 Drawing Sheets

SUPPORT GC & S/D IMPLANTS

US 6,734,056 B2

SELF-ALIGNED PUNCH THROUGH STOP FOR 6F² ROTATED HYBRID DRAM CELL

RELATED APPLICATIONS

This application is a divisional of U.S. application Ser. No. 10/078,926, filed Feb. 20, 2002 now U.S. Pat. No. 6,534,824.

This application is related to co-assigned U.S. application Ser. No. 09/766,013, filed Jan. 18, 2001, the entire content of which is incorporated herein by reference.

FIELD OF THE INVENTION

The present invention relates to semiconductor memory devices, and more particularly to an embedded dynamic random access memory (DRAM) cell array that is scalable to groundrules that are below about 55 nm, without succumbing to a dynamic buried-strap to buried-strap leakage mechanism that is caused by the periodic cycling of an adjacent wordline. A method of forming such an ultra-low scalable memory cell array is also provided herein.

BACKGROUND OF THE INVENTION

As conventional vertical DRAM cells are scaled below a design groundrule of about 110 nm, encroachment of the buried-strap region upon the sidewall of the adjacent storage trench cuts-off the path in which holes can flow into and out of the portion of the P-well above the buried-strap region.

Simulation has demonstrated that floating-well effects limit the scalability of prior art vertical DRAM memory arrays to a minimum distance of about 90 nm between adjacent storage trenches. A number of dynamic leakage mechanisms limiting the scalability of conventional vertical DRAM memory cells have been identified and quantified. Included in the dynamic leakage mechanisms are: (1) Floating-well bitline disturb (FWBD), (2) Transient drain induced barrier lowering (TDIBL), and (3) Adjacent wordline induced punchthrough (AWIPT).

The onset of serious charge loss due to each mechanism occurs at approximately 90 nm end of process deep trench (DT) to deep trench (DT) spacing. Thus, scalability of conventional vertical DRAM memory cells beyond about 110 nm is expected to be limited by floating-well effects.

An illustration of a dominant floating-well dynamic leakage mechanism that limits scalability of prior art vertical DRAM memory arrays is shown in FIG. 1. Specifically, at a time indicated by point A of FIG. 1 and during a long period of about 5–100 ms of repeated writing of a "1" to other memory cells on the bitline, the P-well of an unselected cell storing a "1" may leak up towards bitline voltage ($V_{blh}$), as the exiting of holes is restricted by parasitic JFET. Leakage depends on the degree of well isolation caused by pinchoff from expansion of the storage node depletion region. In an extreme case, the buried-strap region may come in contact with the adjacent deep trench capacitor. Moreover, the hole current through the pinchoff region must keep up with the leakage to avoid a pseudo "Floating-Body Effect".

Insofar as time interval B-C is concerned, the N+ bitline diffusion to P-well barrier is lowered by a downward swing of $V_{blh}$. Electrons emitted from the bitline diffusion region are collected by the storage node resulting in the formation of a parasitic bipolar transistor, $Q_w$, ($PW_{int}$ is a floating base) within the memory cell array.

For aggressively scaled vertical metal oxide semiconductor field effect transistors (MOSFETs) in prior art vertical DRAM memory cells, the depletion region from the storage node diffusion (i.e., buried-strap outdiffusion) encroaches upon the sidewall of the adjacent storage trench, which results in dynamic charge loss from the storage capacitor as the bitline of an unselected device is cycled. This charge loss mechanism is identical to that published in "Floating-Body Concerns for SOI Dynamic Random Access Memory (DRAM)", Proceedings, 1996 IEEE International SOI Conference, Jack Mandelman, et al. pp. 1367–137, October 1996.

An illustration of the storage capacitor voltage vs. the voltage in the portion of the P-well isolated by the depletion region from the buried-strap outdiffusion, as the bitline is cycled, is shown in FIG. 2. When the bitline is held at $V_{blh}$, the isolated portion of the P-well (PWint) leaks up towards the voltage of the adjacent diffusions. With subsequent cycling of the bitline between 0.0 and $V_{blh}$, the dynamic charge loss mechanism results in charge pumping which discharges the storage capacitor. Between data refresh, greater than $10^6$ bitline cycles are possible, which is sufficient to discharge the storage capacitor.

Another problem with prior art DRAM cells is backgating which causes back side leakage that is gated by the adjacent wordline in the DRAM CELL. An illustration of the backside leakage problem is shown, for example, in FIG. 3.

A still other problem with prior art DRAM cells, which contain more than one cell within a common active semiconductor region, is that the scalability of such DRAM cells eventually succumbs to a dynamic buried-strap to buried-strap leakage mechanism that is caused by the periodic cyclic of an adjacent wordline. That is, the scaling of the prior art DRAM cells to groundrules of less than about 90 nm, especially less than about 55 nm, may result in the coupling of the diffusion regions that may cause leakage in the DRAM cell.

In view of the above drawbacks with prior art memory cells, there is a need to provide a new and improved memory cell array which is substantially immune to floating- well and backgating problems, yet is capable of being scaled below 90 nm, especially less than about 55 nm, without succumbing to leakage caused by coupling of buried-strap diffusion regions.

SUMMARY OF THE INVENTION

One object of the present invention is to provide a memory cell array that substantially eliminates floating-well effects that are typically present in prior art memory cells.

Another object of the present invention is to provide a memory cell array that substantially eliminates the prior art backgating problem due to an adjacent wordline.

A further object of the present invention is to provide a memory cell array that is scalable below a minimum feature size of about 55 nm, without succumbing to a dynamic buried-strap to buried-strap leakage mechanism that is caused by the periodic cycling of an adjacent wordline.

A yet further object of the present invention is to provide a memory cell array wherein the channel doping of the cell is reduced, without compromising cell to cell isolation.

These and other objects and advantages are achieved in the present invention by providing a memory cell array that includes, among other components, self- aligned punch through stop regions that do not excessively impinge upon the buried- strap regions. The inventive self-aligned punch through stop regions comprise a locally high concentration of punch through stop dopant such as boron that is substantially confined to the central region between adjacent strap regions of deep trenches.

In one aspect of the present invention, a method of fabricating a memory cell array that includes at least the self-aligned punch through stop regions is provided. The inventive method includes the steps of:

forming double-gated vertical MOSFETs in a plurality of deep trenches that are present in a Si-containing substrate, wherein said double-gated vertical MOSFETs include at least two gates on opposing sidewalls, exposed gate conductors and a buried- strap region;

forming wordlines overlaying said double-gated vertical MOSFETs and in contact with said exposed gate conductors;

forming bitlines on said Si-containing substrate that are orthogonal to said wordlines;

etching isolation trench regions into portions of said Si-containing substrate that are adjacent to rows of deep trenches using said wordlines and bitlines as etch masks, said isolation trench regions having a depth that is deeper than abutting bitline diffusion regions; and forming punch through stop regions into said etched isolation trench regions using said bitlines and wordlines as implant masks, said punch through stop regions are capable of isolating adjacent buried straps from each other and are centrally located about the deep trenches in areas adjacent to said gates, wherein neighboring punch through stop regions in the wordline direction overlap each other under the bitlines.

After the punch through stop regions are formed, the etched isolation trench regions are filled with an oxide material and planarized.

Another aspect of the present invention relates to a memory cell that includes at least self-aligned punch through stop regions having overlapped areas beneath the bitlines. Specifically, the inventive memory cell array comprises:

a plurality of memory cells located in an array portion of a Si-containing substrate which are arranged in rows and columns, each memory cell including a double-gated vertical metal oxide semiconductor field effect transistor (MOSFET) having exposed gate conductor regions and two gates formed on opposing sidewalls of said MOSFETs, wherein one of the opposing sidewalls also includes a confined buried-strap region;

a plurality of wordlines overlaying said double-gated vertical MOSFETs and in contact with said exposed gate conductor regions, said wordlines being arranged in said column direction;

a plurality of bitlines that are orthogonal to said wordlines;

trench isolation regions located adjacent to said rows of memory cells, wherein said trench isolation regions have a depth that is deeper than abutting bitline diffusion regions; and a plurality of punch through stop regions located in said Si-containing substrate, wherein said plurality of punch through stop regions in said column direction overlap each other under said bitlines and serve to electrically isolate adjacent buried-strap regions from each other.

BRIEF DESCRIPTION OF THE DRAWINGS

In FIGS. 5–15, top views (A) are shown as well as cross-sectionals through various cuts including through the deep trench region (B), Y1—Y1, and through the region between rows of deep trenches (C), Y2—Y2. In some instances, a cut through the cross-section perpendicular to Y1—Y1 and Y2—Y2, i.e., X1—X1 is shown. Cut X1—X1 is in a plane containing both storage trench and the body of the vertical MOSFET (D).

DETAILED DESCRIPTION OF THE INVENTION

The present invention which provides a method of fabricating a memory cell which includes at least self-aligned punch through stop regions will now be described in greater detail by referring to FIGS. 4–17 which accompany the present application.

Figure 1:
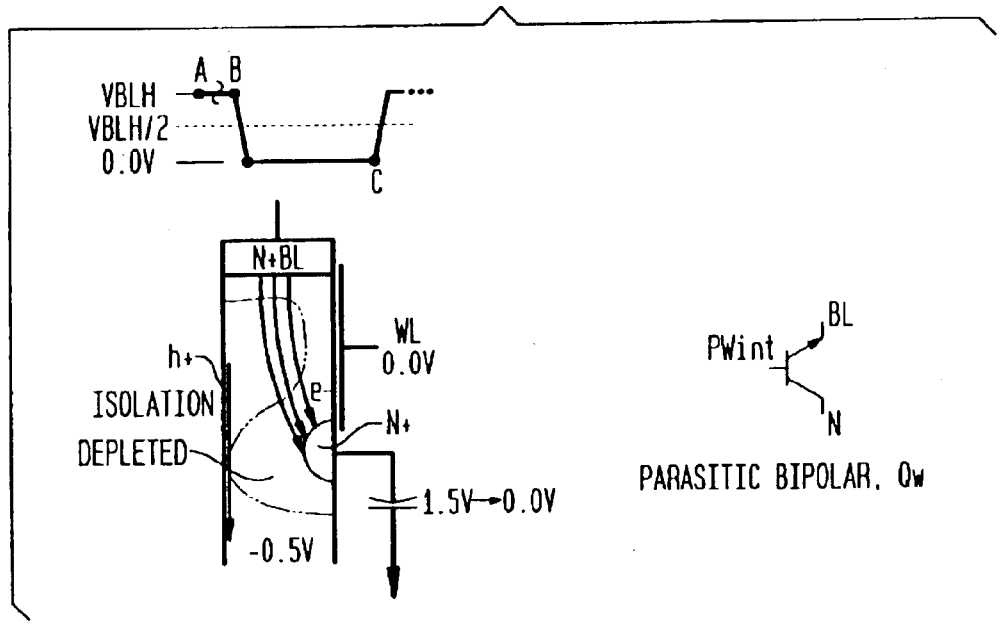
FIG. 1 is a schematic that explains the floating-well effects in a conventional hybrid memory cell.
Figure 2:
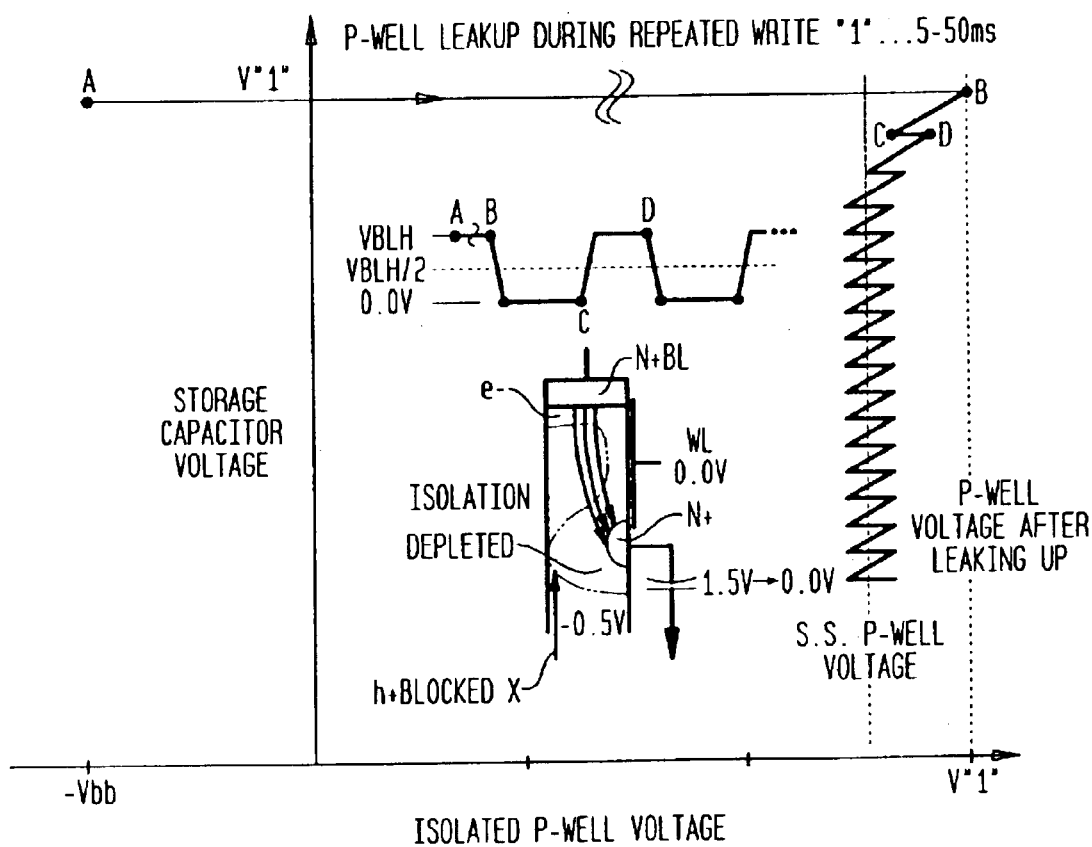
FIG. 2 is an illustration of storage capacitor charge loss with repeated bitline cycling in an unselected conventional hybrid memory cell.
Figure 3:
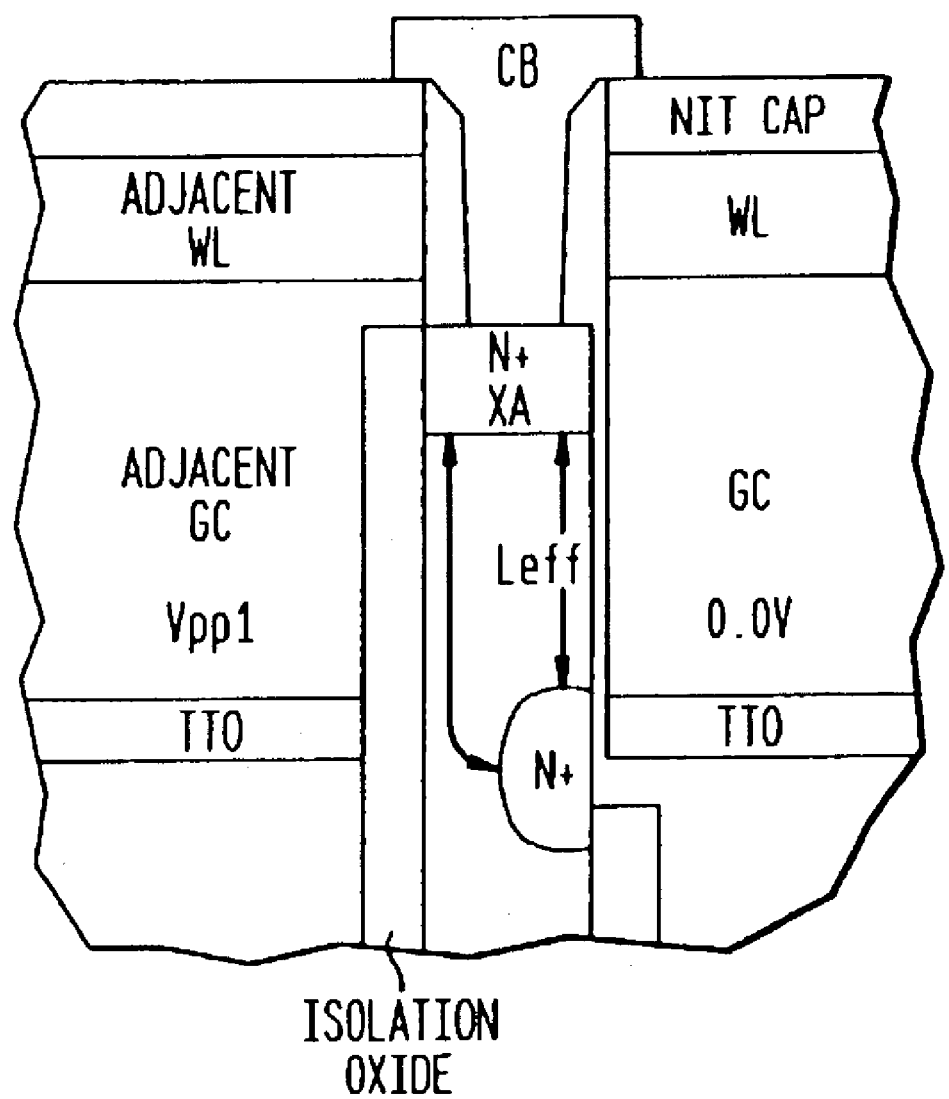
FIG. 3 is an illustration of the backside leakage problem of a prior art memory cell.
Figure 4:
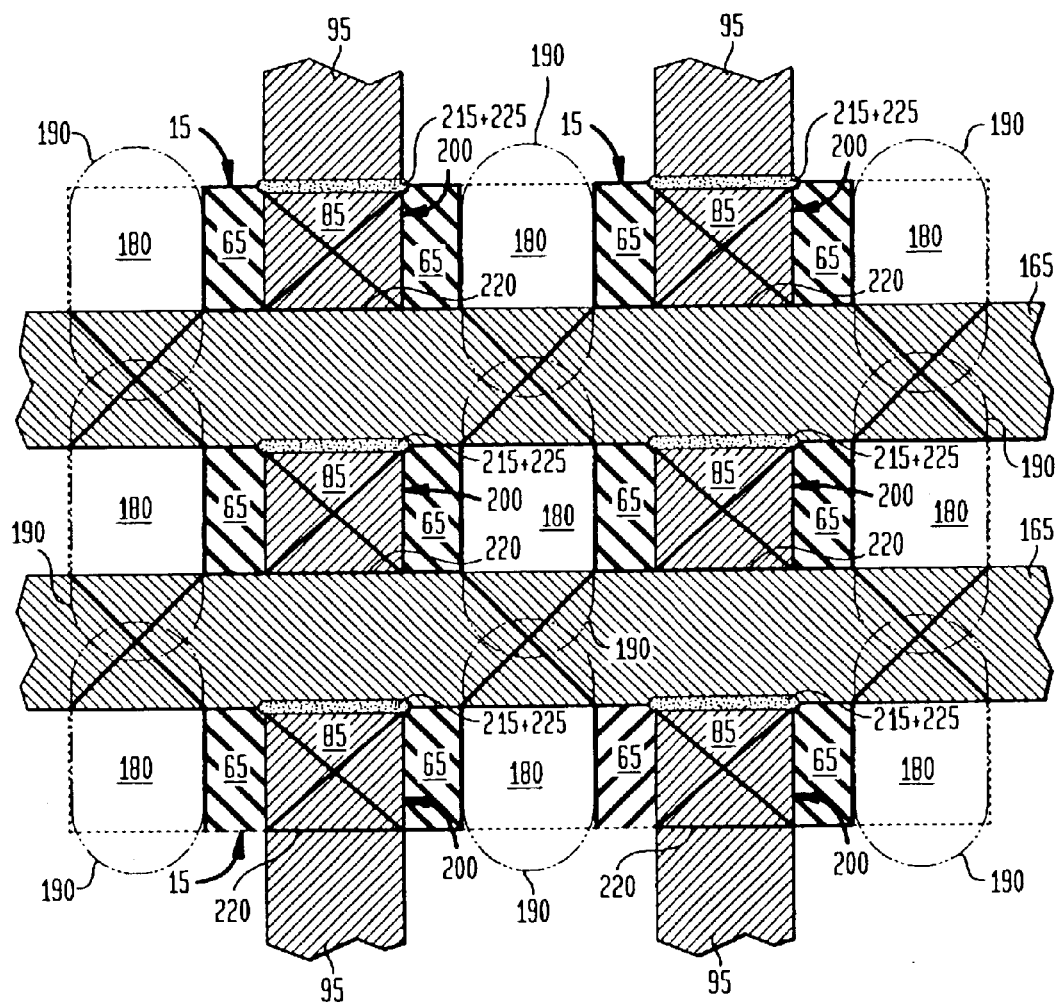
FIG. 4 is an illustration of the inventive memory cell that includes at least the self-aligned punch through stop regions.
Figure 5A:
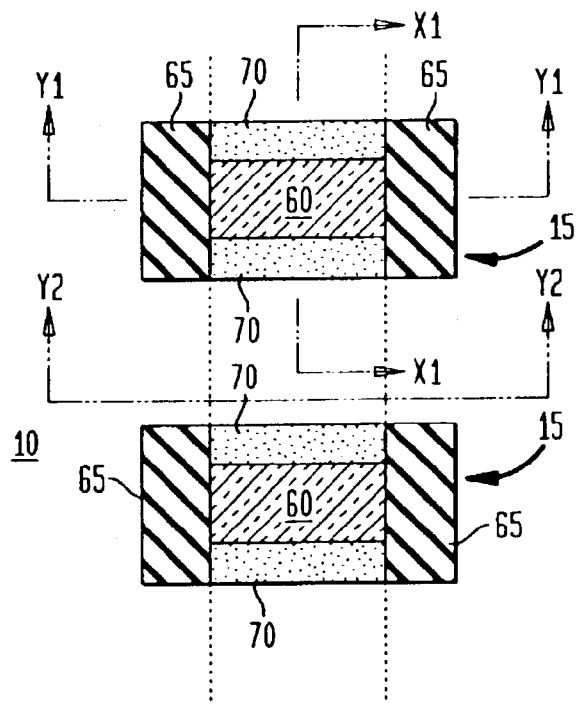
FIGS. 5–15 are pictorial views illustrating the inventive memory cell through various processing steps of the present invention.
Figure 5B:
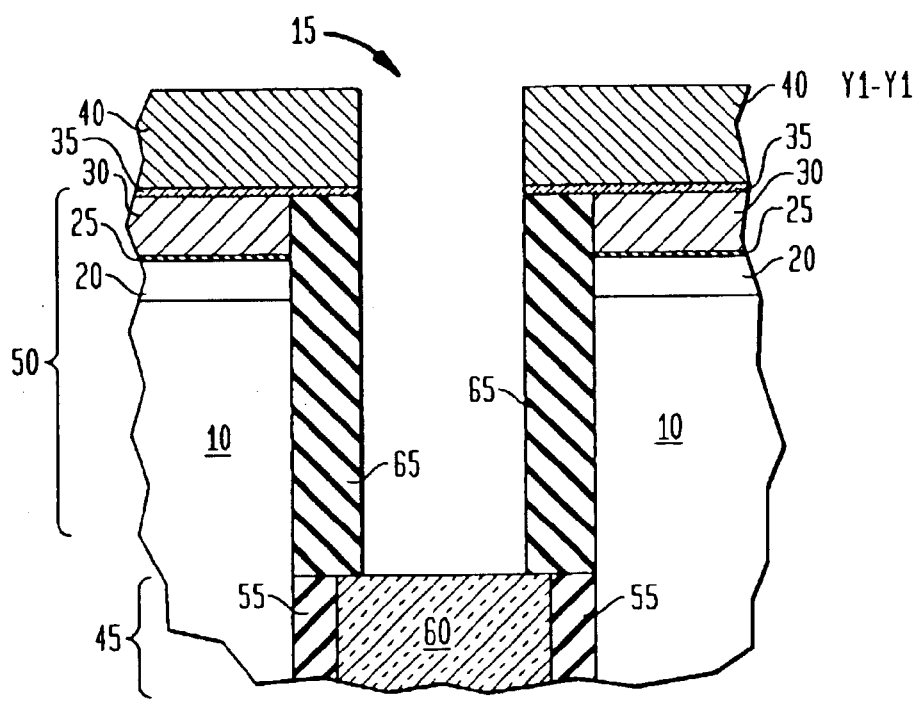
Figure 5C:
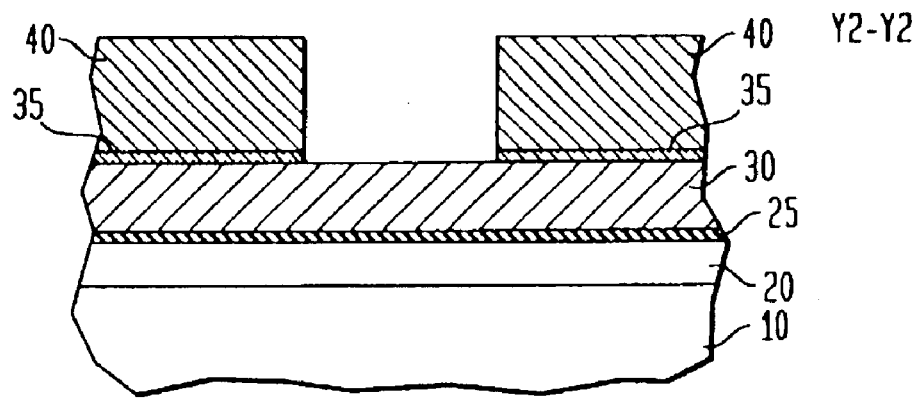
Figure 5D:
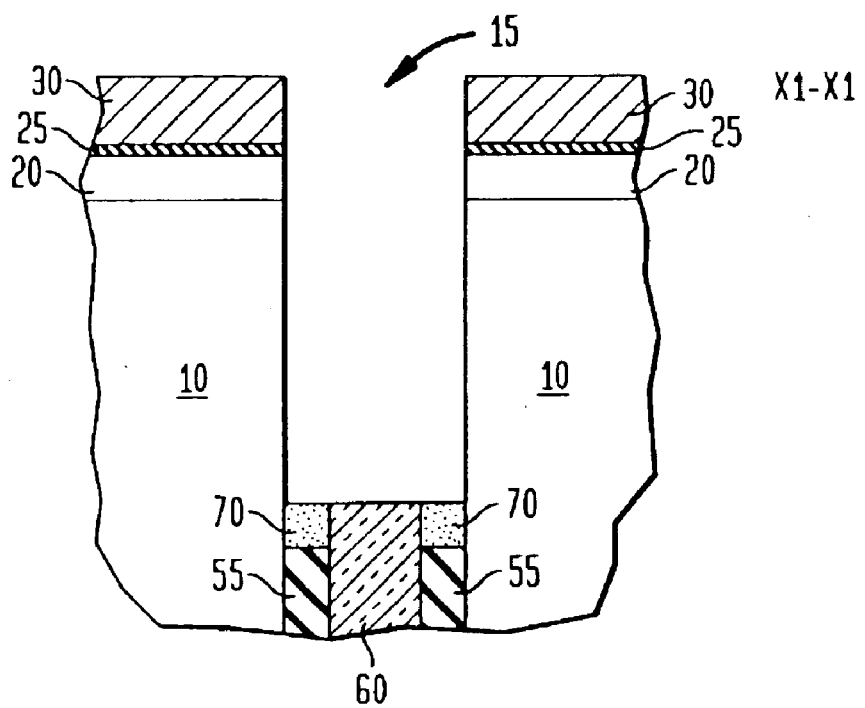
Figure 6A:
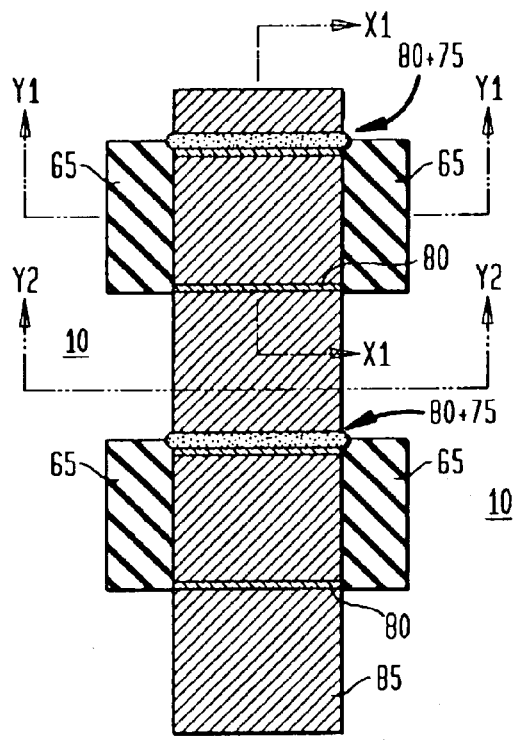
Figure 6B:
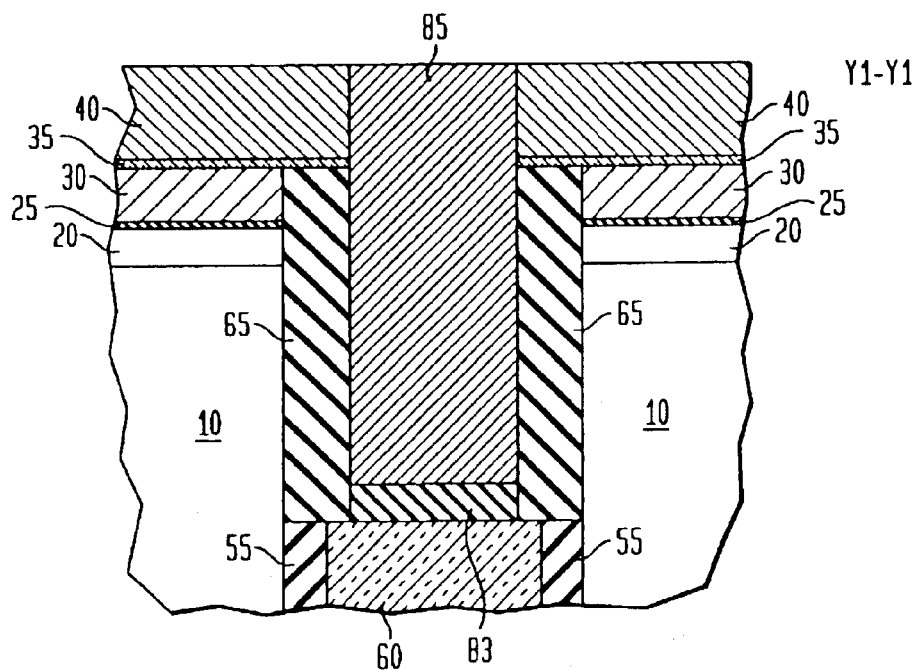
Figure 6C:
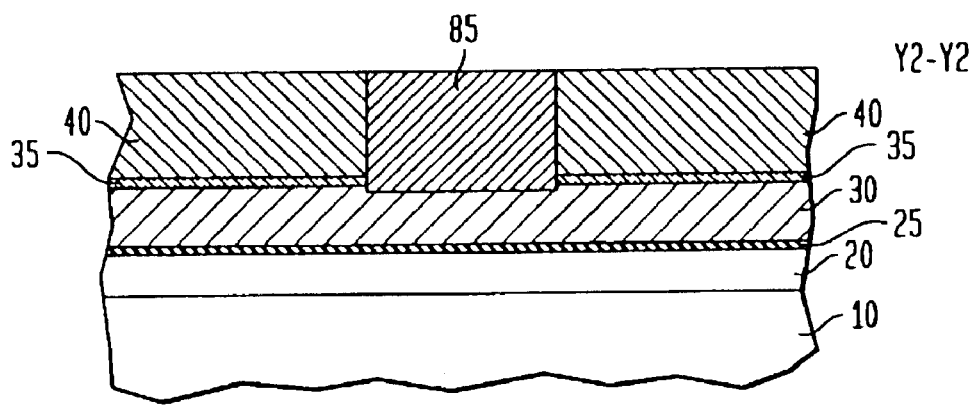
Figure 6D:
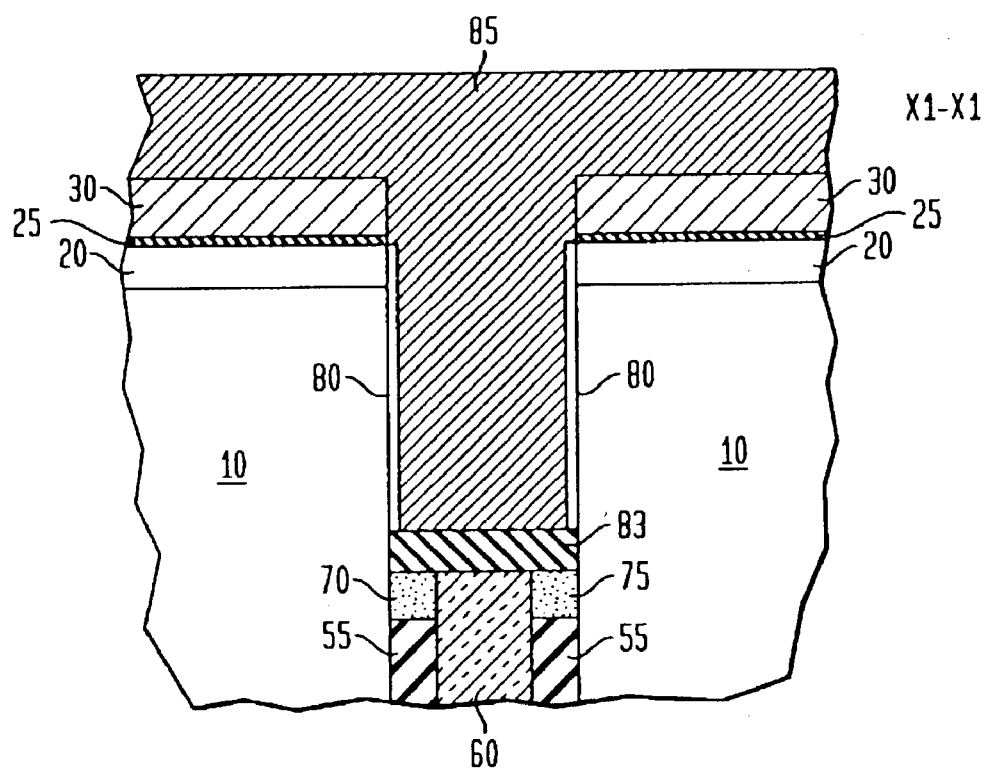
Figure 7A:
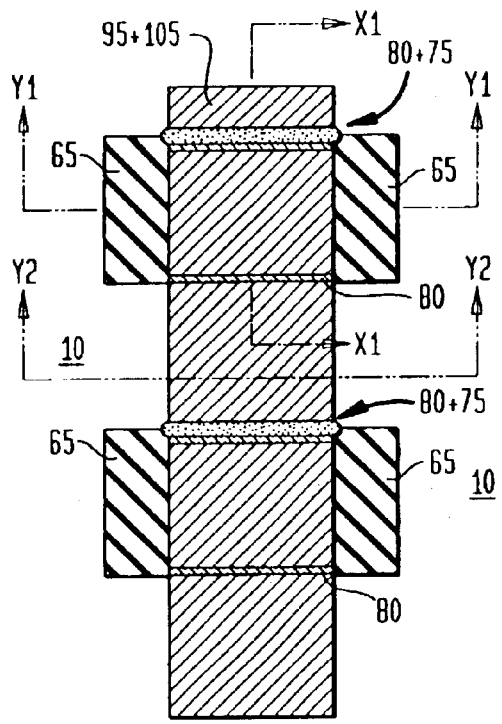
Figure 7B:
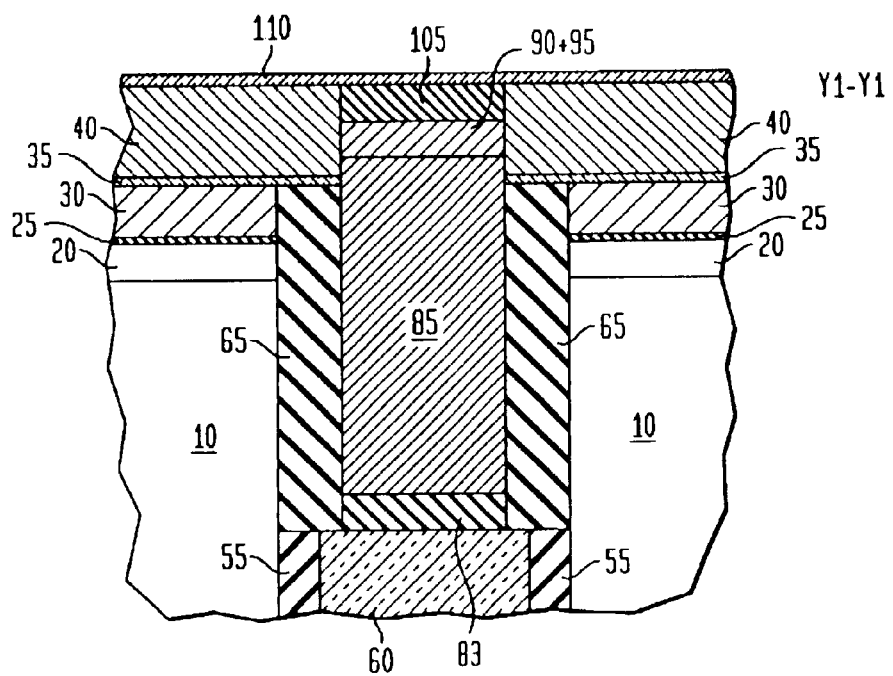
Figure 7C:
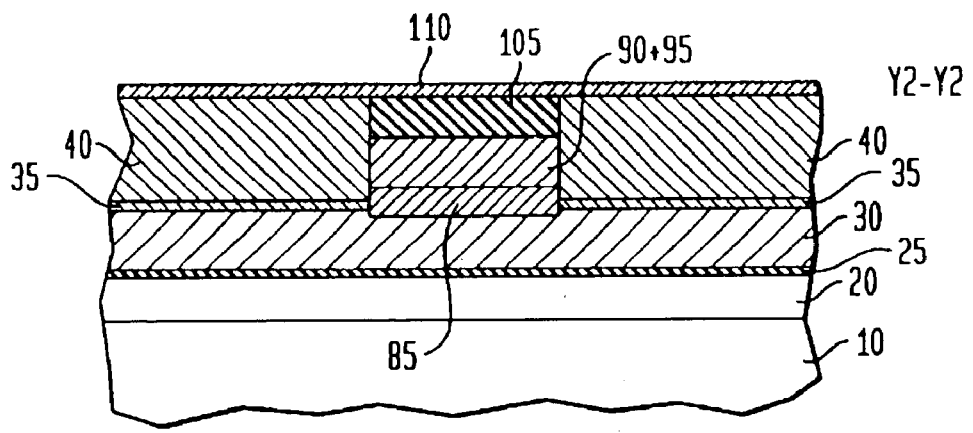
Figure 7D:
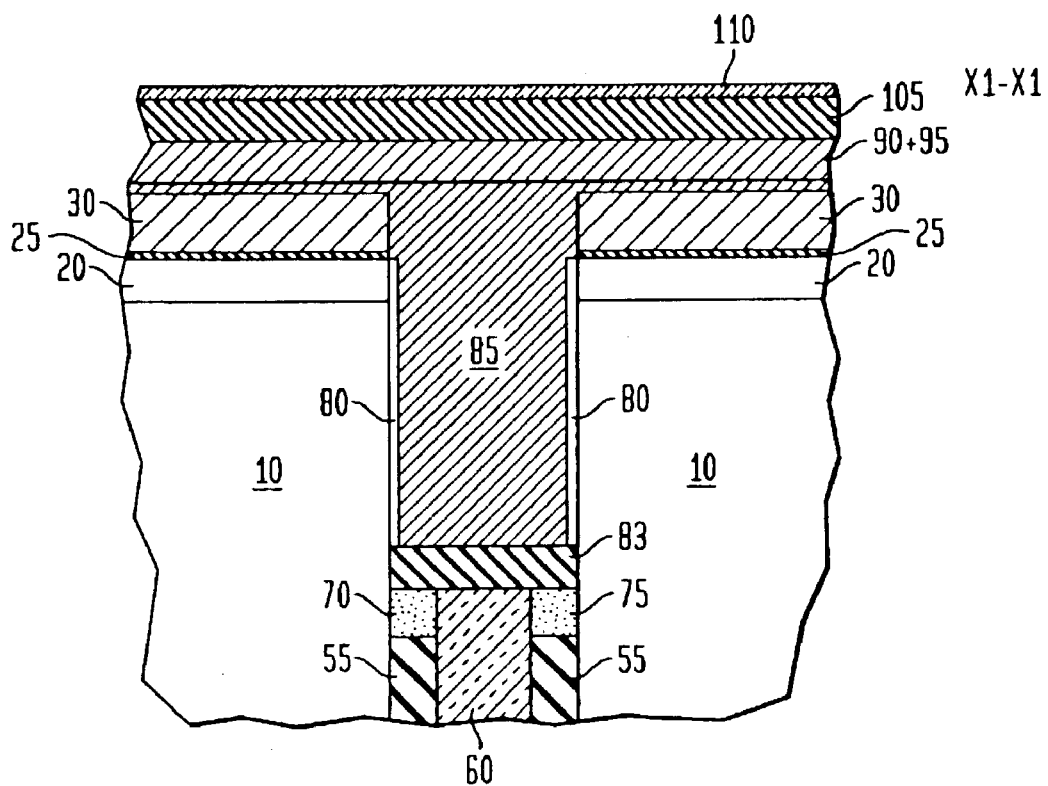

Reference is first made to FIG. 4 which is pictorial representation (Top view) of the inventive memory cell of the present invention. Specifically, the inventive memory cell of the present invention includes a plurality of memory cells 200 which are arranged in rows and columns. It is noted that in this figure only the array portion of the inventive cell is shown; the support portion of the memory cell is not shown for clarity. Each memory cell includes a vertical metal oxide semiconductor field effect transistor (MOSFET) having exposed gate conductor regions 85 and gates (215, 220) that are formed on opposing sidewalls of said MOSFET, wherein one of the opposing sidewalls also includes confined buried-strap 225. Note the sidewalls containing both gates and the buried-strap are located within adjacent deep trenches (DT) 15.

The memory cell of FIG. 4 also includes a plurality of wordlines 95 formed over the vertical MOSFETs and in contact with exposed gate conductor regions 85; as shown, wordlines 95 are arranged in columns. The inventive memory cell also includes a plurality of bitlines 165 that are orthogonal to wordlines 95; and trench isolation regions 180 formed adjacent to rows of memory cells. In accordance to the present invention, the trench isolation regions have a depth that is deeper than abutting bitline diffusion regions (not shown in this view).

As is shown, the wordlines run in the y-direction over the middle of the deep trenches and contact the array gate conductors. Thus, the active area of each vertical MOSFET is gated on both the front and back sides by the same wordline; eliminating the adjacent wordline backgating problem of prior art cells. The front-gated side (top end of the DT in FIG. 4) contains both a gate dielectric and a strap; and the back-gated side. (bottom of the deep trench in FIG. 4) contains only a gate dielectric. Note the regions of mandrel oxide 65 shown on the ends of the deep trench which serve to cut the strap, resulting in a confined strap which prevents node-to-node leakage in the bitline direction.

Node-to node leakage is further prevented in the present invention by providing self-aligned punch through stop regions 190 (represented by the dotted ovals) underneath the trench isolation regions. The self-aligned punch through stop regions are capable of isolating adjacent buried-strap regions from each other and are centrally located about the deep trenches in areas adjacent to said gates. As shown, neighboring punch through stop regions in the wordline direction overlap each other under the bitlines. The overlapping self-aligned punch through stop regions form a narrow region of localized higher punch through stop dopant concentration which does not significantly increase the doping concentration at the buried-strap; therefore avoiding degradation and leakage.

Bitline conductors run in the x-direction between deep trenches and are in electrical contact with silicon upon which they lie. Both wordlines and bitlines are capped by an insulating layer such as an oxide which serves as an etch mask for the isolation regions in the array. The isolation regions in the array are formed in the present invention by etching silicon selective to the capping material and to oxide. The isolation regions are etched to a depth which is slightly deeper than the bitline diffusion regions, allowing continuity to the upper portion of the well and avoiding floating-well conditions.

Following the etching of the isolation trench regions in the array region, self-aligned punch through stop regions 190 are formed by ion implantation. An oxidation step is employed in the present invention to drive the dopant beneath the bitlines. In accordance with the present invention, the punch through stop regions are located substantially below the bottom surface of the isolation trench regions.

As is illustrated in FIG. 4, the bitlines and wordlines are rotated by 90° relative to prior art memory cells. An exemplary wordline in the inventive layout results in the simultaneous gating of both the front and back gates by that wordline; thus, activation of an adjacent wordline does not directly gate the backside of the array MOSFET.

The inventive wordline scheme results in a double-gated vertical MOSFET for the DRAM transistor. It is recognized by those skilled in the art that double-gated MOSFETs (from planar MOSFET and surround-gate devices) exhibit much stronger gate control, leading to increased on-current, steeper sub-$V_t$ slope, reduced substrate sensitivity, and reduced short-channel effects (DIBL), than observed on conventional single-sided gated MOSFETs of comparable physical dimensions. The channel length of the vertical MOSFETs in the inventive cell may be further reduced since DIBL is reduced which leads to even more on-current. It is noted that in the present invention the distance between adjacent deep trenches is minimized in the wordline direction. This is opposite to current technology wherein the objective is to increase the distance between deep trenches. By minimizing the distance between adjacent deep trenches, the inventive memory cell can operate in a fully depleted state.

The processing scheme, which is employed in the present invention in fabricating the above-described memory cell, will now be described in more detail by referring to FIGS. 5–15 which illustrate the various processing steps of the present invention. As stated above, top views are shown as well as cross-sectional views through various cuts including the deep trench region, Y1—Y1, and through the region between rows of deep trenches, Y2—Y2. In some instances, a cut through the deep trench and vertical MOSFET body regions, X1—X1, is also shown.

Reference is first made to FIGS. 5A–D which illustrate a portion of the inventive memory cell (array region) following collar divot fill with a strap placeholder material. Specifically, the structure shown in FIGS. 5A–D comprises a Si-containing substrate 10 having at least one deep trench 15 formed therein. The term "deep trench" is used herein to denote a trench whose depth from the top surface of the Si-containing substrate is from about 1.0 $\mu$m or greater. The structure illustrated in FIGS. 5A–D also includes bitline diffusion regions 20 formed in the surface of the substrate, pad oxide 25 formed over the bitline diffusion regions, first pad nitride layer 30 formed on the pad oxide layer, oxide etch stop layer 35 formed on said first pad nitride layer and second nitride pad layer 40 formed on the oxide etch stop layer. It is noted that the deep trench is formed through the various materials layers mentioned above stopping at a predetermined depth in the Si-containing substrate; thus the various materials layers abut the deep trench region.

The deep trench region includes a lower region (not shown), middle region 45, and an upper region 50. The lower region is the portion of the deep trench in which the capacitor element (i.e., storage capacitor) of each individual memory cell is formed, while the upper region of the deep trench is the portion of the deep trench in which the double-gated vertical MOSFET of each individual memory cell is formed. Middle region 45 is located between the capacitor and MOSFET of the each individual memory cell.

The middle region of the deep trench includes collar oxide regions 55 that are formed on exterior sidewalls of the deep trench and deep trench polysilicon 60 formed between the collar oxide regions. The collar oxide regions include a divot that is filled with a strap placeholder material 70. The upper portion of the deep trench, at this point of the inventive method, includes oxide mandrels 65 which are formed on the sidewalls of the upper trench region.

The structure shown in FIGS. 5A–D is formed utilizing the following processing steps and materials. First, pad oxide 25 having a thickness of about 5 nm or less is thermally grown on the surface of Si-containing substrate 10 and thereafter bitline diffusion regions 20 are implanted into the Si-containing substrate utilizing a conventional implantation process well known to those skilled in the art. First nitride pad layer 30 having a thickness of from about 10 to about 100 nm is then deposited on the pad oxide layer utilizing a conventional deposition process such as chemical vapor deposition (CVD) and plasma-assisted CVD that is well known to those skilled in the art. Following the formation of the first nitride layer, an optional hard mask (not shown in the drawings) may be formed on the first nitride layer.

Deep trenches 15 (one of which is shown in FIGS. 5A–D) are the formed in the customarily manner of opening a trench pattern extending through the first nitride layer, the pad oxide layer, the bitline diffusion regions and a portion of the Si- containing substrate via lithography and anisotropic etching. The deep trenches which are formed in rows and columns into the surface of the Si-containing substrate are the areas in which the inventive double-gated vertical MOSFETs are formed. An oxidized polysilicon buffered LOCOS (local oxidation of silicon) collar 55 or other like collar oxide is then formed in a portion of the deep trench.

Next, a capacitor (not shown in the drawings) is formed in the lower portion of the deep trench utilizing conventional deep trench capacitor processing steps that are well known to those skilled in the art. Included in the deep trench capacitor processing steps is the formation of a buried plate diffusion region (not shown), and the formation of a node dielectric (not shown) about said buried plate diffusion region. The deep trench is then filled with deep trench polysilicon 60 and planarized utilizing a conventional planarization process such as chemical-mechanical polishing (CMP).

The deep trench polysilicon is recessed by conventional means to a depth which is desired for the strap (determines the channel length of the double-gated vertical MOSFET; typically of from about 100 to about 400 nm). A layer of oxide such as high-density plasma (HDP) oxide or CVD oxide which subsequently is formed into mandrel oxide regions 65 is deposited to a thickness which completely fills the opening above the recessed deep trench polysilicon and thereafter the layer of oxide is planarized to first nitride pad layer 30.

Next, thin etch oxide etch stop layer 35 having a thickness of from about 5 to about 20 nm is deposited by conventional means such as CVD and second nitride layer 40 is then deposited by a conventional deposition process such as CVD. The first and second nitride layers may be composed of the same or different nitride containing material. For example, the first and second nitride layers may be both composed of SiN.

A mandrel stripe removal mask (not shown) having a predetermined pattern formed thereon is then formed on the second nitride layer and a conventional etching process is employed to open the second nitride layer stopping on the oxide etch stop layer. The etching process used during this step of the present invention has a high- selectivity for removing nitride as compared to oxide. An example of such an etching process is reactive-ion etching (RIE).

After opening the second nitride layer, the exposed oxide etch stop layer is removed as well as underlying portions of the HDP or CVD oxide layer utilizing an etching process that has a high-selectivity for removing oxide as compared to nitride or polysilicon. It is noted that during this etching step mandrel oxide regions 65 are formed on the upper sidewalls of the deep trench region and etching is stopped on deep trench polysilicon 60.

The oxide etching mentioned above continues so as to form divots in exposed portions of the collar oxide. The divots are then filled with a nitride material so as to form collar divots 70 that are filled with a strap placeholder material.

Following the formation of the collar filled divots in the deep trenches, a masked or maskless one-sided strap (OSS) process is employed to etch a collar filled divot from one side of the deep trench wherein a confined buried-strap is to be formed. After etching one side of the deep trench, the divot is filled with strap polysilicon 75.

Next, a trench top oxide (TTO) 83 (See Y1—Y1 cut in FIG. 6B) is formed on all horizontal surfaces including the deep trench polysilicon and divot filled collar oxide regions utilizing conventional deposition processes and thereafter a conventional resist recess process is employed to remove the trench top oxide from top surfaces of the structure. A sacrificial oxide layer (not shown) is next formed and stripped utilizing conventional lithography and etching and gate dielectric 80 such as an oxide is formed on the exposed vertical sidewalls of the upper portion of the deep trench. The gate dielectric is formed in the present invention utilizing any well-known process such as thermal oxidation of silicon or by nitridation of an oxide. Alternatively, a deposited gate dielectric, such as by CVD, may be formed. A gate conductor material 85 such as doped polysilicon is then formed on the gate dielectric and the structure is planarized to the second nitride layer forming the structure shown in FIGS. 6A–D.

After planarizing the gate conductor, the gate conductor is recessed utilizing a conventional recessing process and diffusion barrier 90 (See, in particular FIG. 7B) such as WN is formed on the recessed gate conductor utilizing a conventional deposition process. Next, a highly conductive metal 95 such as W is deposited on the diffusion barrier utilizing a conventional deposition process. The deposited conductive material is planarized and recessed and thereafter capping layer 105 is formed on the recessed conductive material. The capping layer is composed of any insulator material such as an oxide. It is noted that the recessed highly conductive material forms wordlines 95 of the memory cell. Thus, reference numeral 95 is used to describe both the highly conductive material and the wordlines. Following capping of the wordlines, an etch stop protect layer 110 such as SiN is deposited on the entire surface of the structure including supports region and array region. It is noted that up until this point of the present method, the array MOSFET was being fabricated; See FIGS. 7A–D.

Figure 8:
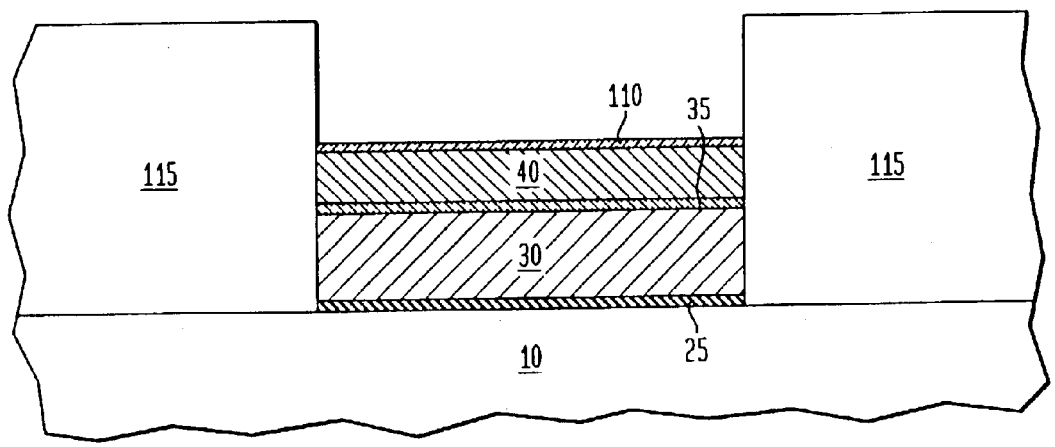
Figure 9:
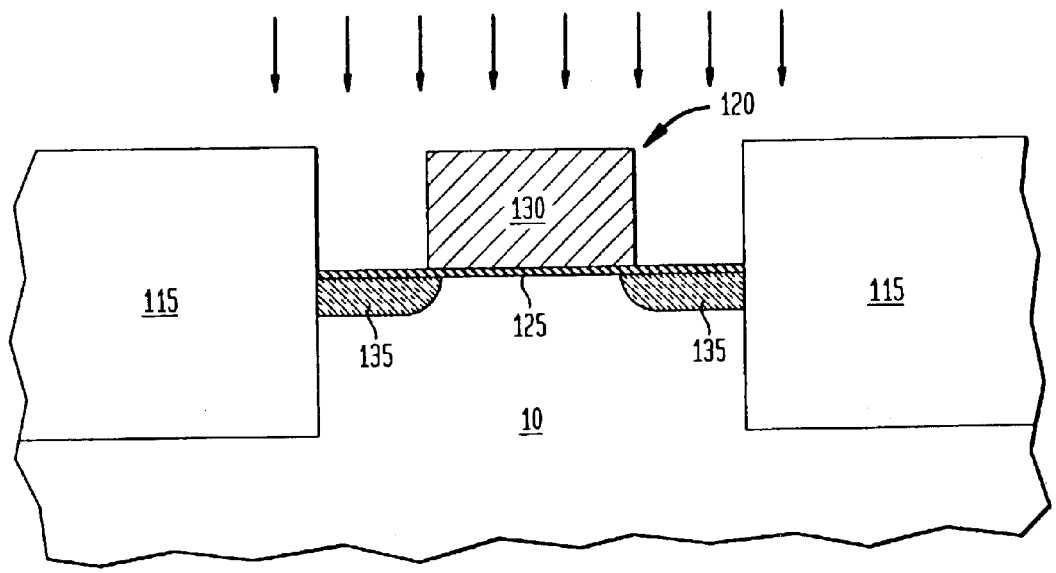

After protecting the array MOSFET, the support MOSFETs are now fabricated. Specifically, as shown in FIG. 8, the support isolation trench regions 115 are first formed and thereafter (See FIG. 9) support MOSFETs 120 are formed. The support isolation trench regions are formed by first patterning the active area in the support region utilizing a conventional lithography step. The pattern is then opened forming trenches in the structure which extend to the Si-containing substrate.

An oxidation process is then performed, the trenches are filled with an oxide material and thereafter the oxide fill is planarized to the etch stop protect layer 110 formed above.

The support MOSFETs are then formed as follows: A block mask (not shown) is formed on the structure to open etch stop protect layer 10, second nitride layer 40, oxide barrier and pad nitride layers to the pad oxide in the supports. Next, a conventional well implant is employed through the pad oxide layer and thereafter the pad oxide is stripped from the supports region. A gate dielectric 125 such as an oxide, nitride or oxynitride is formed by a conventional thermal oxidation or nitridation process and the support gate conductor 130 is deposited and planarized to isolation trench regions 115. The support gate conductor is thereafter patterned (by conventional lithography and etching) so as to strip support polysilicon from the array selective to nitride. The patterned gate conductor is thereafter subjected to a conventional gate sidewall oxidation process and ion implantation processes are employed in doping the gate conductor and forming source/drain regions 135 in the supports region, See FIG. 9.

Figure 10:
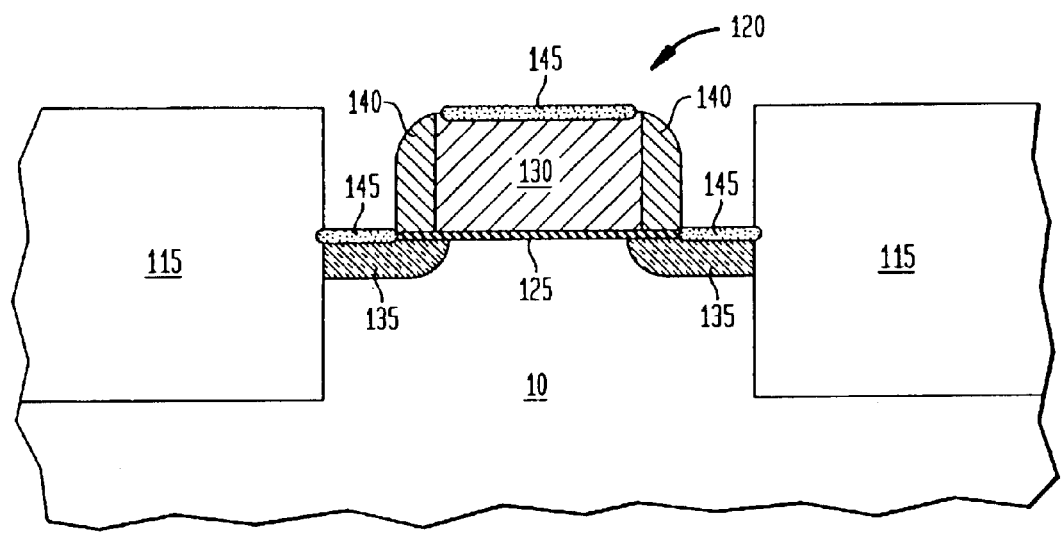

FIG. 10 shows the supports region after sidewalls spacers 140 are formed on the gate conductor and after a conventional salicidation process is employed. The sidewall spacers are composed of a conventional insulating material such as SiN and are formed by deposition and etching. The salicidation process forms salicide regions 145 on the top of the gate conductor as well as surfaces of the Si-containing support that overlay the source/drain regions.

Figure 11:
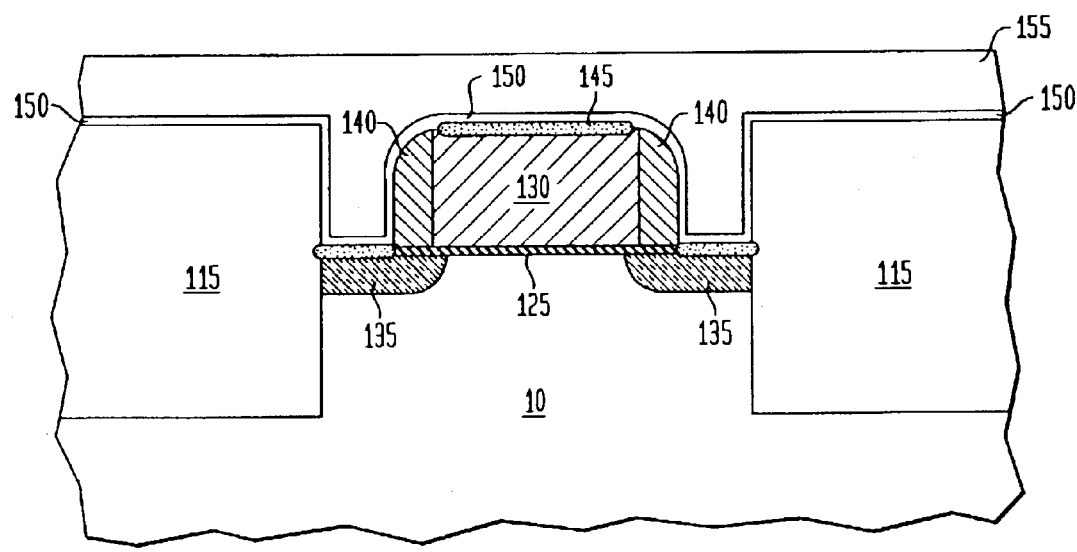
Figure 12A:
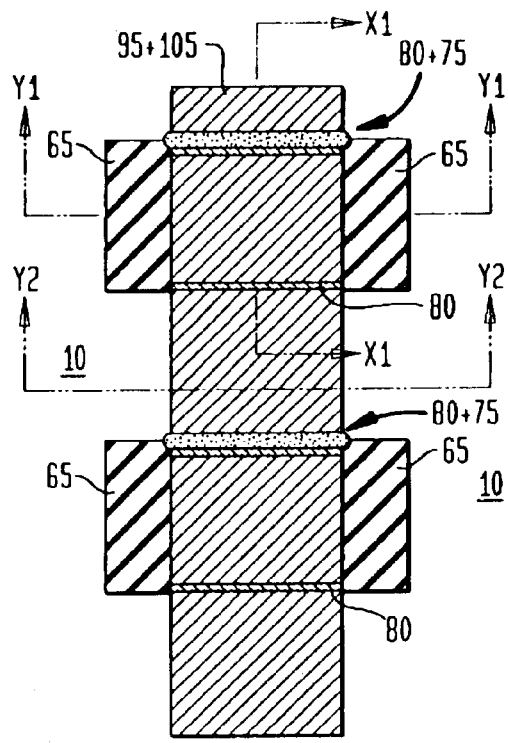
Figure 12B:
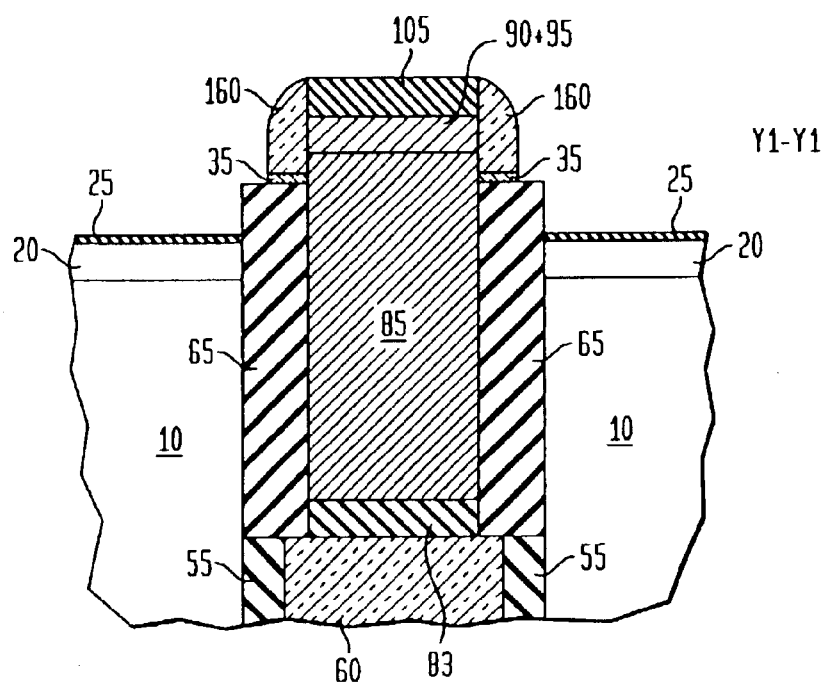
Figure 12C:
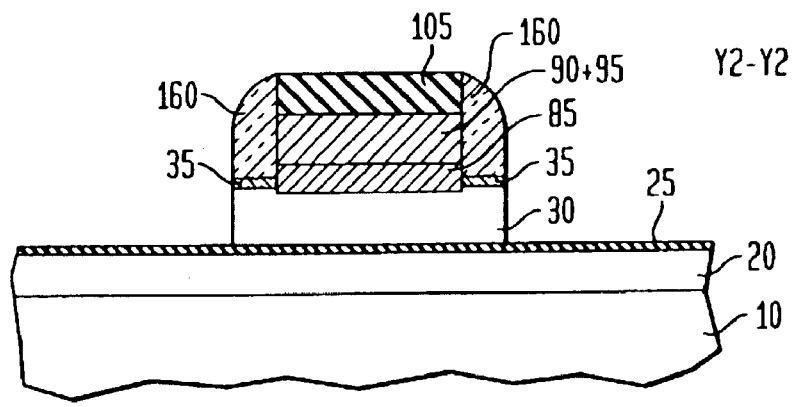
Figure 12D:
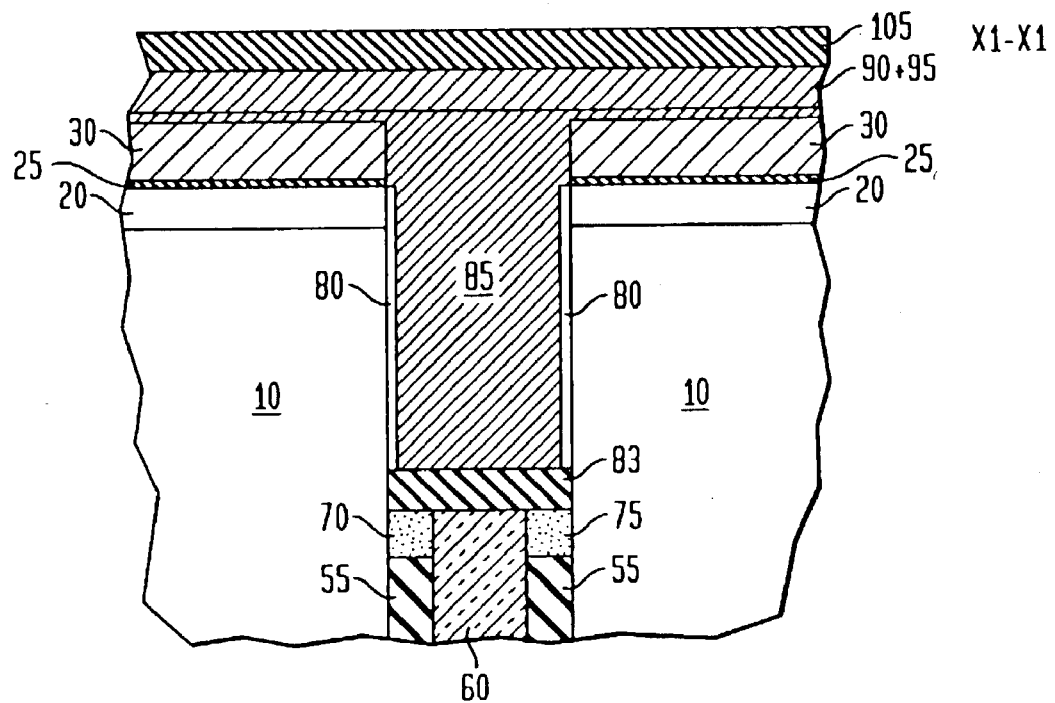
Figure 13A:
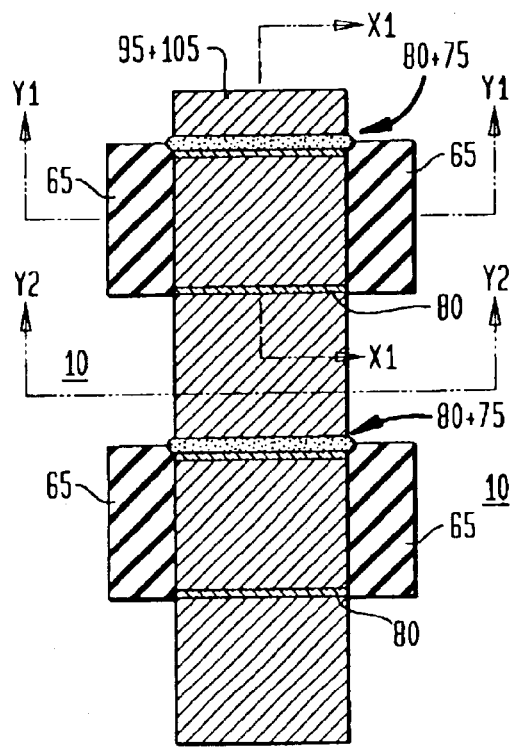
Figure 13B:
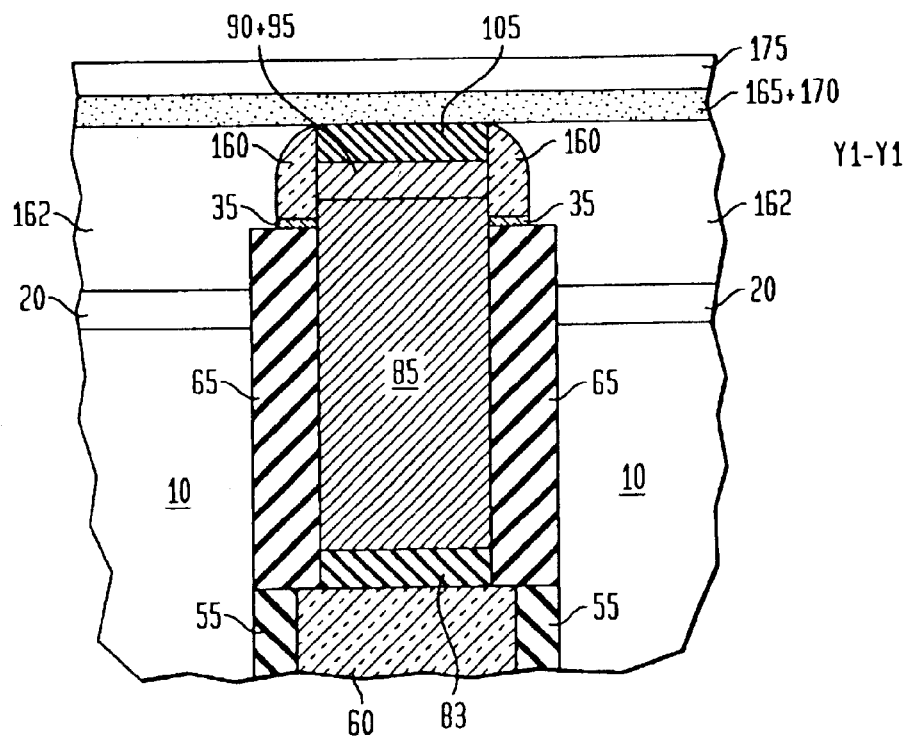
Figure 13C:
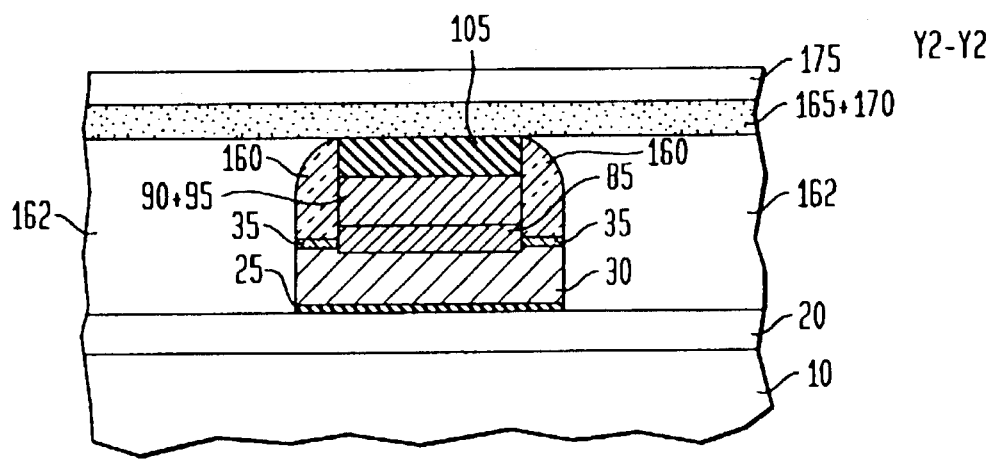
Figure 13D:
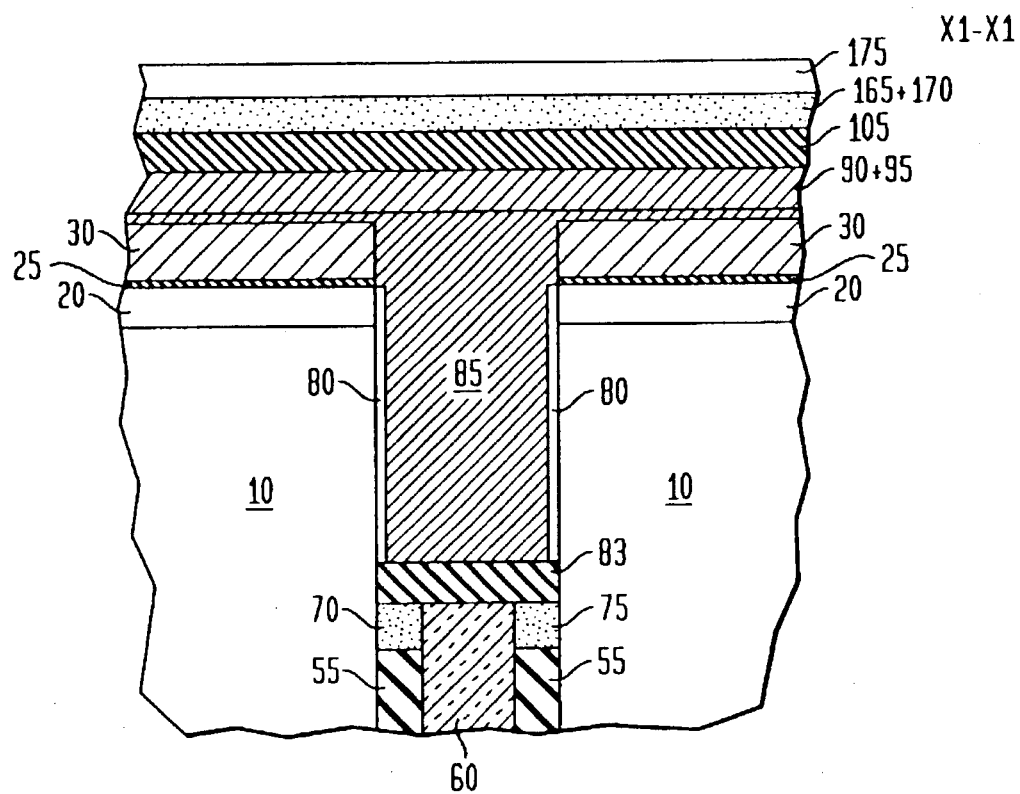
Figure 14A:
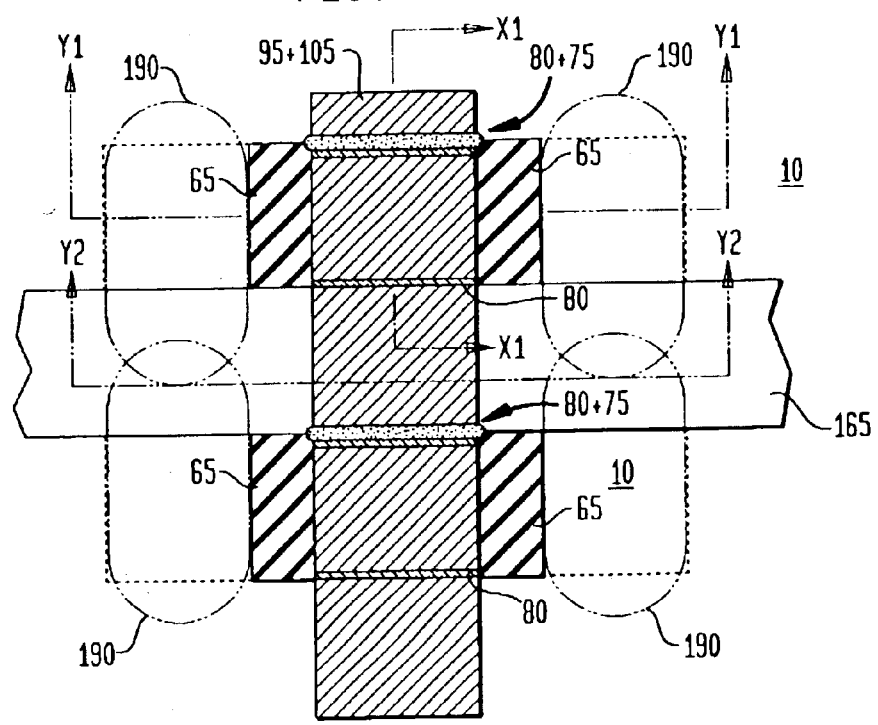
Figure 14B:
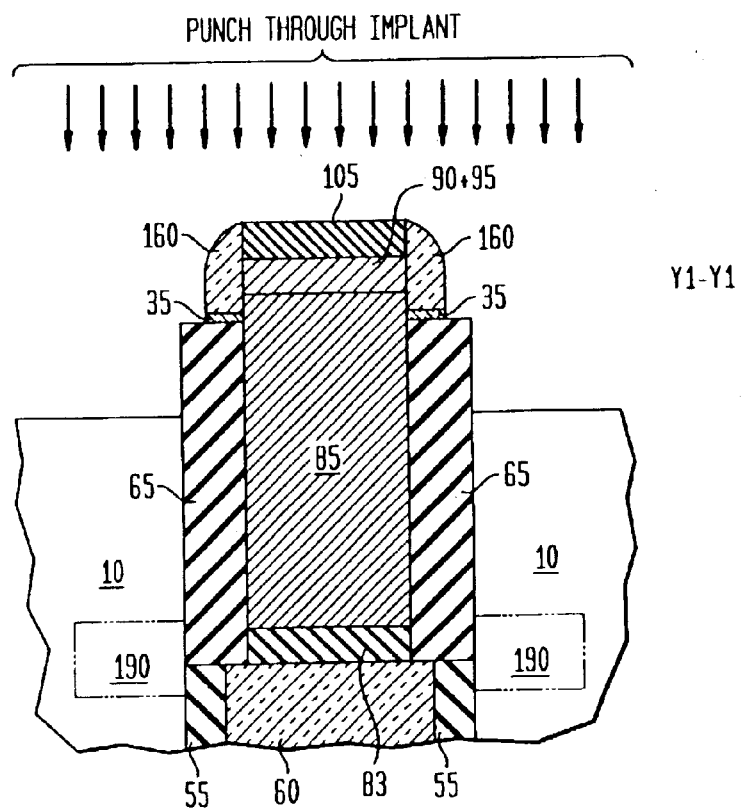
Figure 14C:
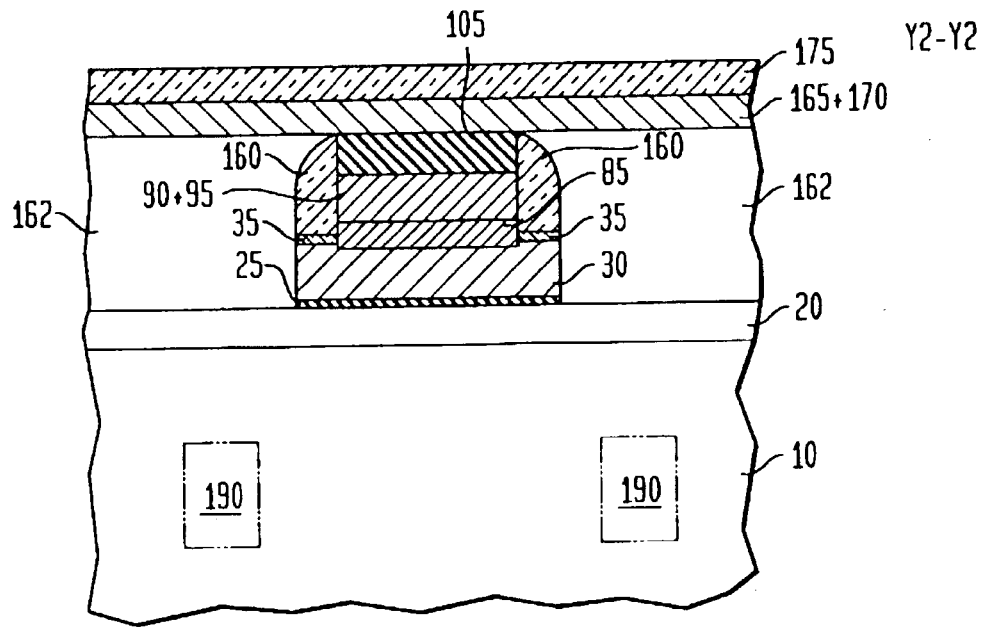
Figure 14D:
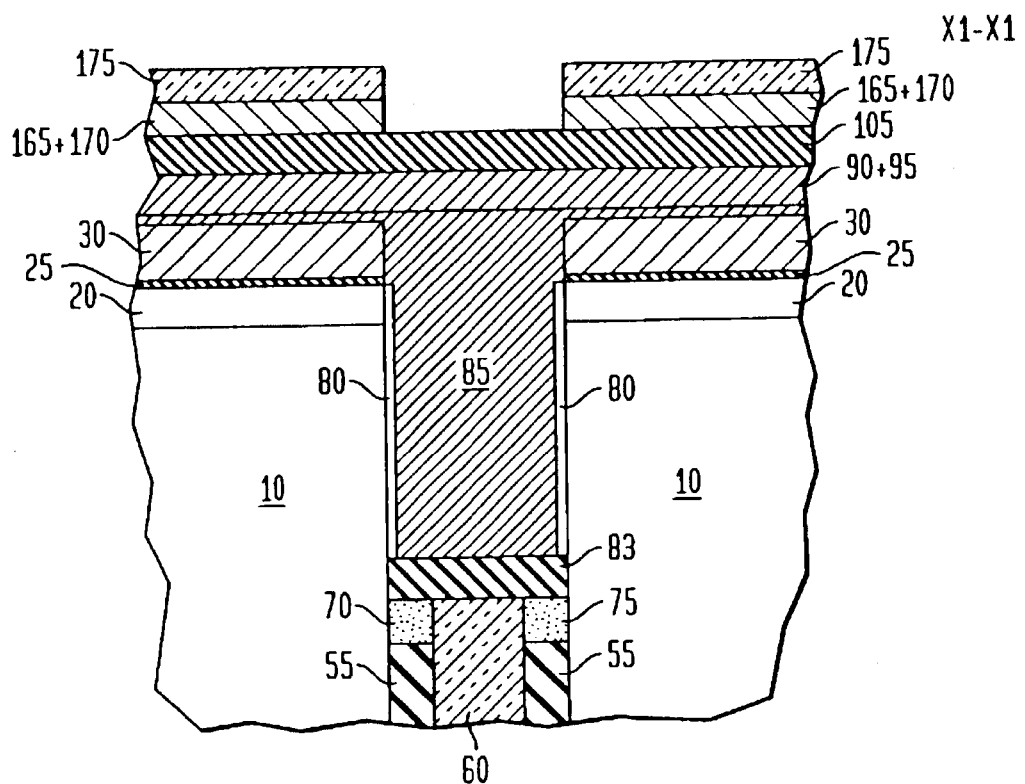
Figure 15A:
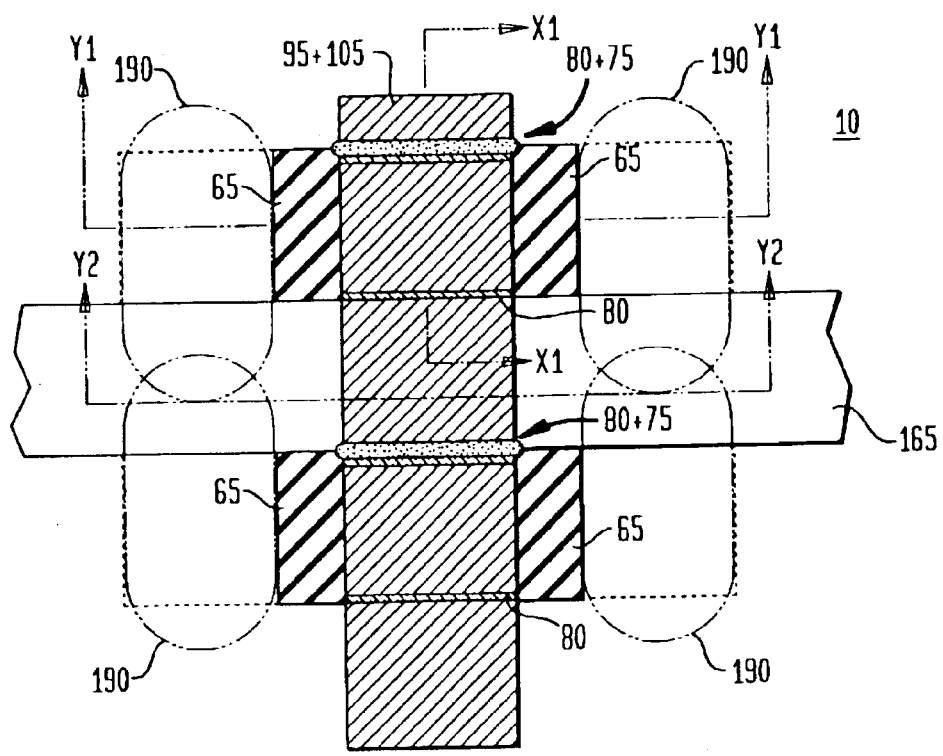
Figure 15B:
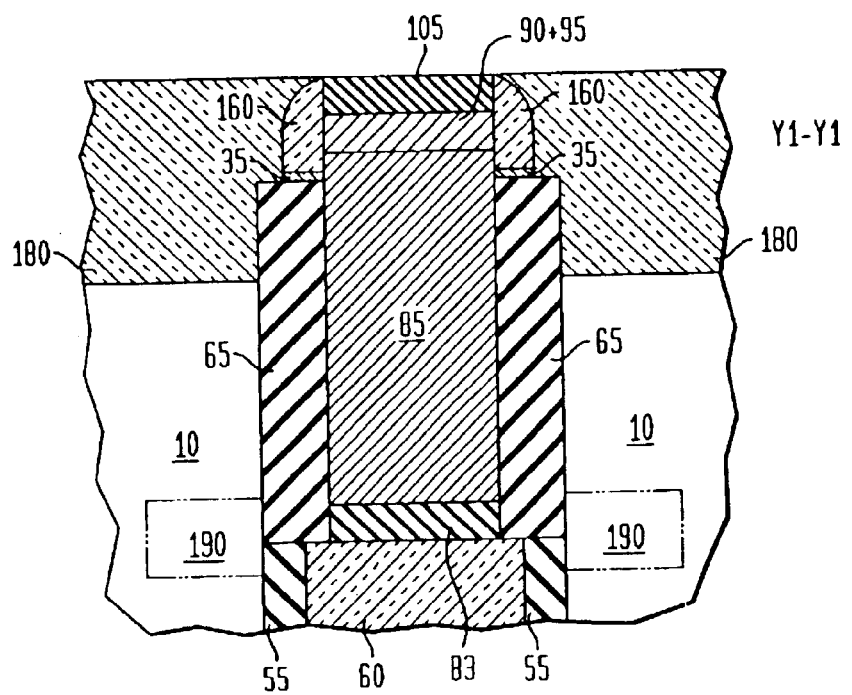
Figure 15C:
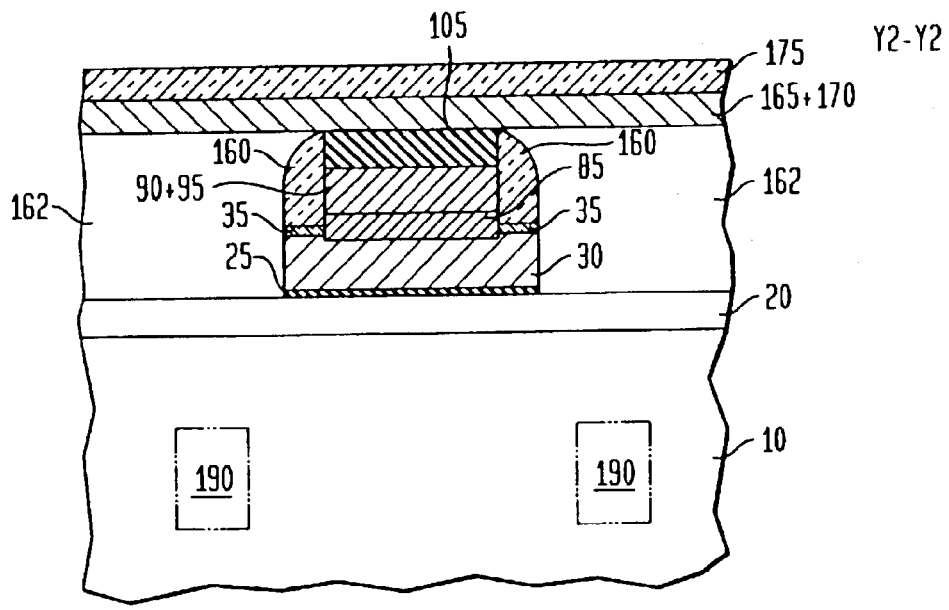
Figure 15D:
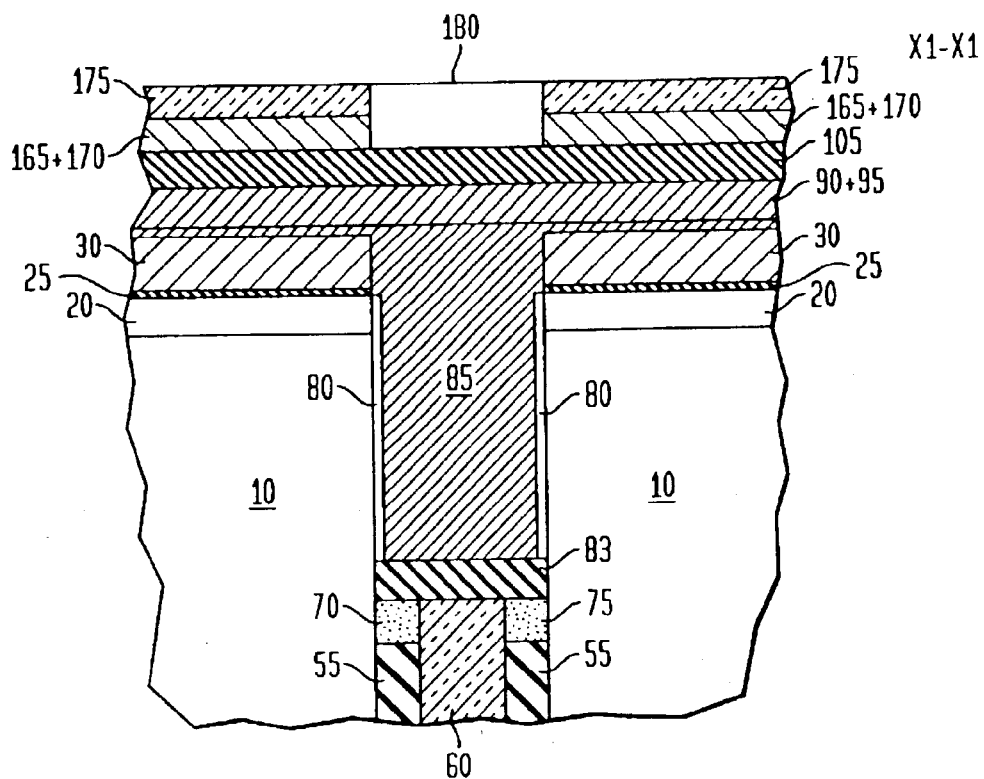

FIG. 11 shows the supports region after deposition of a thin nitride layer 150 and an ionic contamination protect layer 155 such as boron doped silicate glass (BPSG) and planarization. FIG. 11 shows the completed support MOSFET (120) that is formed in the present invention. After formation of the supports MOSFET, the array processing is resumed. Specifically, the ionic contamination protect layer 155 and nitride layer 150 formed in FIG. 11 are removed in the array region, while protecting the supports MOSFET with a block mask. Any conventional etching process which is capable of removing ionic contamination protect layer 155 and nitride layer 150 while stopping at or slightly beyond etch stop protect layer 110 can be employed in the present invention.

Next, any remaining etch stop protect layer 110 and second nitride layer 40 are removed selective to oxide in the arrays, stopping on etch stop layer 35, utilizing a conventional etching process. A CVD oxide layer is then deposited by conventional means and etched to form oxide spacers 160. A conventional RIE process through nitride pad 30 selective to oxide and silicon is then performed providing the structure shown in FIGS. 12A–D.

The remaining pad oxide layer is then stripped from the array utilizing a conventional etching process that has a high selectivity for removing oxide as compared to silicon and then bitlines 165 are formed (FIGS. 13A–13D). Specifically, the bitlines are formed by first depositing a doped polysilicon layer 162 having the same conductivity as the bitline diffusion regions on the Si surfaces of the memory cell that is adjacent to the array MOSFET. This doped polysilicon layer is formed utilizing a conventional in-situ deposition process or by deposition followed by ion implantation. The doped polysilicon layer is then planarized to oxide (removing any doped polysilicon from the supports) and a bitline barrier layer 170 composed of WN or other like diffusion barrier material is formed. Next, W or $WSi_x$ (hereinafter referred to as bitline 165) is deposited on the bitline barrier layer and oxide cap 175 is formed on the bitline. The structure fabricated from these steps of the present invention is shown in FIGS. 13A–D.

After formation of the bitline conductor stack over the bare silicon, the oxide cap is patterned into bitline stripes. The bitline stripes are used as a mask and a conventional etching process selective to oxide is conducted through bitline 165, bitline barrier 170, doped polysilicon 162 and Si-containing substrate 10. Oxide capping layer 105 over the wordline and oxide spacers 160 on the sidewalls of the wordlines, in addition to patterned oxide cap 175, forms the hardmask for the subsequent isolation trench etch. In accordance with the present invention, this etching process is such that the Si is recessed beneath the depth of the bitline diffusion region. It is noted that this recessed area is the area in which the array isolation regions 180 will be subsequently formed.

Next, punch through stop regions 190 are formed into recessed Si-containing area formed above providing the structure shown in FIGS. 14A–D. Specifically, the punch through stop regions are formed by first implanting a punch through stop dopant into the recessed Si areas using the bitlines and the wordlines as implantation masks. This avoids the direct implantation into the active silicon areas between adjacent vertical MOSFETs. In accordance with the present invention, the implantation of dopant into the recessed Si areas is carried out using ion implantation conditions that are well known in the art. For example, a boron ion implantation step carried out at an implant energy of from about 10 to about 35 keV may be used in forming the punch through stop regions. It is noted that other dopant ions besides boron, and other implant energies are also contemplated in the present invention.

After the implantation of the punch through stop dopant into the recessed Si areas, the structure is subjected to an oxidation step that is capable of driving the punch through stop dopant laterally from the implanted area into the recessed Si areas. The oxidation step also forms a passivating oxide layer on the exposed silicon sidewalls. The oxidation step may be performed using various conditions that are also well known to those skilled in the art (i.e., furnace oxidation, rapid thermal oxidation). For example, oxidation may be performed at a temperature of from about 750° to about 1100° C. for a time period of from about 10 seconds to about 30 minutes. Alternatively, the oxidation step may be replaced with an anneal step or a combination of oxidation and anneal. The purpose of this step is to laterally diffuse the punch through step dopant under the bitlines. This step of the present invention serves to provide overlapping self-aligned punch through stop regions 190 under the bitlines. Specifically, the oxidation step serves to form a narrow region of localized higher dopant concentration that does not significantly increase the doping concentration at the buried-strap regions, thus avoiding degradation of junction leakage.

Figure 16:
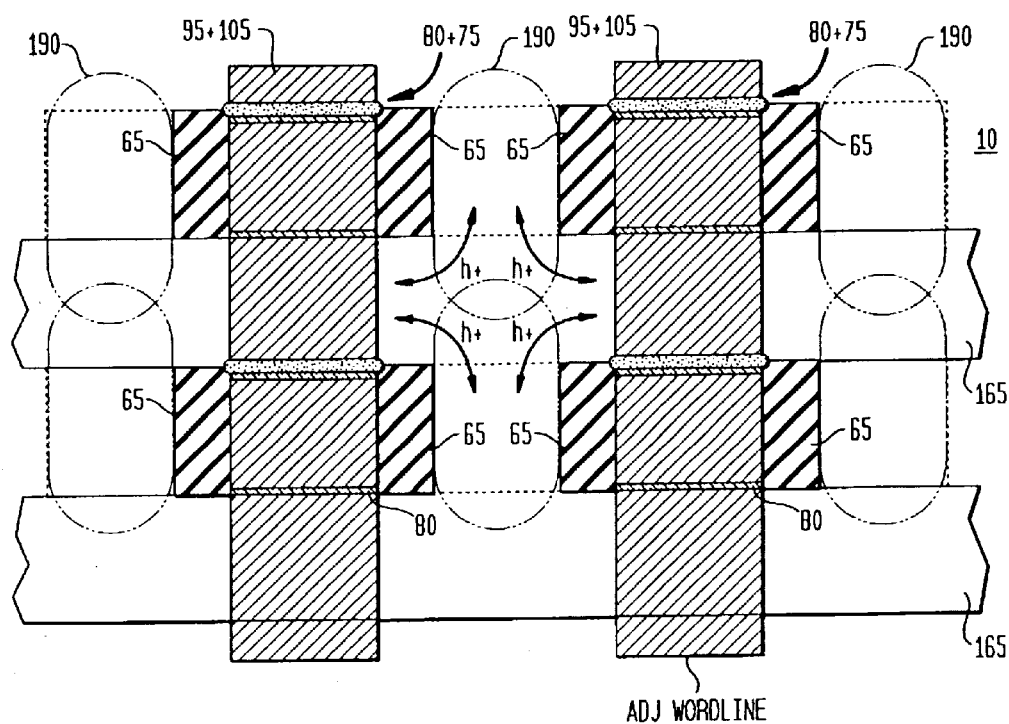
FIG. 16 is a top view showing the current path to provide holes to the well and body regions of each vertical MOSFET.
Figure 17:
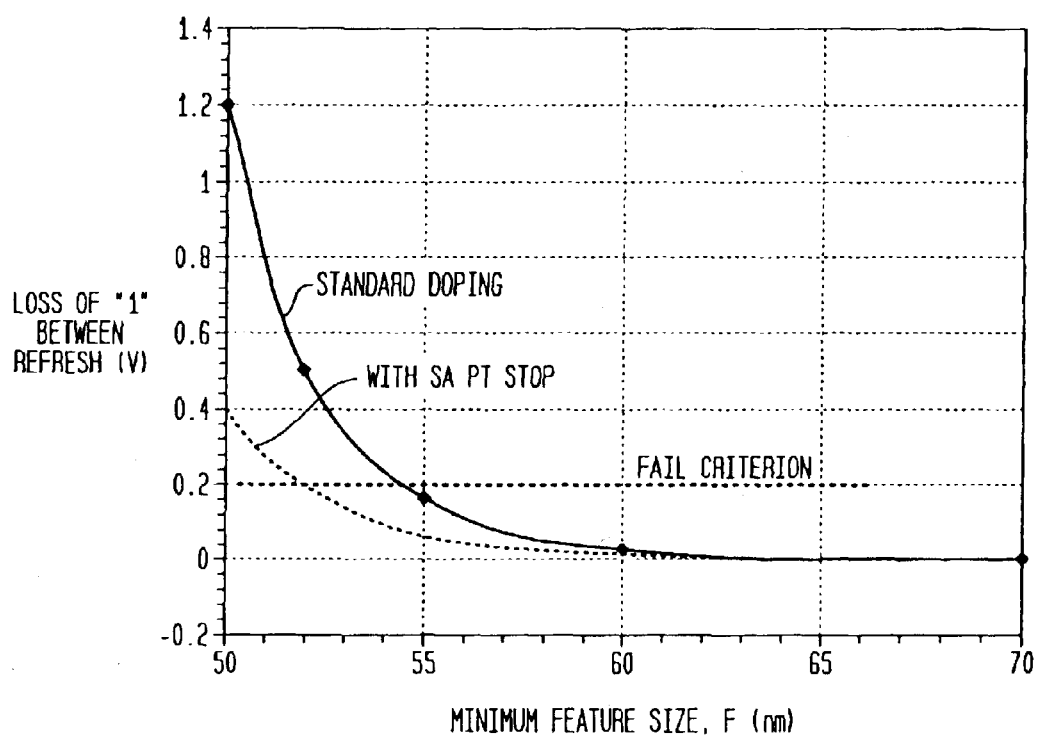
FIG. 17 is a graph of loss of "1" between refresh, V, vs. minimum feature size, F (in mn).

The recessed area is this filled with an oxide material (or other dielectric fill material) and planarized to approximately the top surface of the oxide-capping layer forming array isolation regions 180, See FIGS. 15A–D. FIG. 16 shows a top view of the inventive structure showing the current paths to provide holes h+ to the well and body regions.

As stated above, the present invention provides a memory cell array that is scalable below about 55 nm. The degree of extendability of the minimum feature size is illustrated by the curves shown in FIG. 17. With standard process of a memory cell array (approximately $6E17$ $cm^{-3}$ boron doping concentration at the buried-strap outdiffusion region from strap to strap) a loss of about 200 mV from a stored "1" level after 265 ms of repeated cycling of the adjacent wordline, due to dynamic leakage mechanism, is expected to occur at a minimum feature size of approximately 54 nm. A modest increase in local doping concentration in the self-aligned punch through stop region to $8E17$ (while maintaining the $6E17$ constraint adjacent the strap) results in being able to extend the minimum feature size to nearly 51 nm, without exceeding a loss of 200 mV. Of course, the implant depth (i.e., energy) and dose can be optimized to provide the greatest amount of improvement in feature size reduction, consistent without exceeding the maximum well doping at the strap required for acceptable junction leakage; the amount of improvement may exceed what is actually illustrated herein.

Besides providing the capability of reducing the minimum feature size constrained by dynamic strap to strap leakage, the inventive structure and process may be used to allow a reduction in the well doping concentration in the channel of the vertical MOSFET and at the strap junction, while providing satisfactory immunity to the dynamic leakage mechanism. It is desirable to reduce the channel doping concentration since fully depleted operation between gates of the vertical MOSFET of the inventive memory cell can be achieved at higher groundrules than is possible with customarily practiced channel doping concentration. With a fully-depleted operation, near ideal sub- $V_T$ slope, a near zero substrate sensitivity and higher-on current is possible. However, with standard process, reduction in channel doping also reduces the doping between adjacent cells (between straps) and compromises the immunity to the dynamic leakage mechanism.

The inventive structure overcomes this limitation by providing a localized region (self-aligned punch through stop region) of higher doping concentration between adjacent cells. Reduced channel doping dictates the use of negative wordline low or mid- gap workfunction or alternative workfunction gate conductor material to assure that the off-current objective is met. As shown in "A Notched Metal Gate MOSFET for sub-0.1 μm Operation", by S. Pidin, et al. 2000, IEDM, a TiN may be applied directly to the surface of the gate dielectric to achieve a mid-gap workfunction gate conductor. By depositing a TiN layer in the upper portion of the trench prior to deposition of the polySi gate conductor, the workfunction of the vertical array MOSFET may be set to mid-gap allowing a reduction in channel doping while meeting off-current and isolation design objectives.

Reduction of the doping concentration at the strap junctions may also be desired as a means of reducing unanticipated junction leakage due to the presence of crystal defects.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a memory cell array composing the steps of:

forming double-gated vertical MOSFETs in a plurality of deep trenches that are present in a Si-containing substrate, wherein said double-gated vertical MOSFETs include at least two gates on opposing sidewall, exposed gate conductors and a buried- strap region;

forming wordlines overlaying said double-gated vertical MOSFETs and in contact with said exposed gate conductors, forming bitlines on said Si-containing substrate that are orthogonal to said wordlines;

etching isolation trench regions into portions of said Si-containing substrate that are adjacent to rows of deep trenches using said wordlines and bitlines as etch masks, said isolation trench regions having a depth that is deeper than abutting bitlines diffusion regions; and forming punch through amp regions into said etched isolation trench regions using said bitlines and wordlines as implant masks, said punch through stop regions are capable of isolating adjacent buried straps from each other and are centrally located about the deep trenches in areas adjacent to said gales, wherein neighboring punch through stop regions in the wordline direction overlap each other under the bitlines.

2. The method of claim 1 wherein said punch through stop regions are formed by ion implantation and oxidation; implantation and anneal; or implantation and a combination of oxidation and anneal.

3. The method of claim 2 wherein said ion implantation is carried using boron as the punch through stop dopant.

4. The method of claim 3 wherein said boron is implanted at an energy of from about 10 to about 30 keV.

5. The method of claim 2 wherein said oxidation is performed at a temperature of from about 750° to about 1100° C. for a time period of from about 10 seconds to about 30 minutes.

6. The method of claim 1 further comprising the steps of filling the etched isolation trench regions with a dielectric fill material and planarizing.

7. The method of claim 1 wherein each of said double-gated vertical MOSFETs is formed by processing steps that comprise forming a pad oxide layer on a surface of said Si-containing substrate; forming said bitline diffusion regions in said Si- containing substrate; depositing a first nitride pad layer on said pad oxide layer, patterning and etching through said first nitride pad layer and said pad oxide layer so as to form said plurality of deep trenches; forming capacitor and collar oxide regions in said plurality of deep trenches, wherein said collar oxide regions include recessed deep trench polysilicon; forming mandrel oxide regions on said recessed deep trench polysilicon, while forming divots in said collar oxide regions and depositing SiN in said divots.

8. The method of claim 1 wherein said wordlines are formed by processing steps that comprise recessing said exposed gate conductor, depositing a diffusion barrier layer in said recess; forming a conductive material on said diffusion barrier layer; recessing said conductive material and forming a dielectric capping layer on said recessed conductive material.

9. The method of claim 1 wherein said bitlines are formed by processing steps that comprise forming doped polysilicon on bare Si-containing substrate; depositing a diffusion barrier layer on said doped polysilicon forming a conductive material on said diffusion barrier layer, and forming a capping layer on said conductive material.

10. The method of claim 9 further comprising patterning said capping layer into bitline stripes.

* * * * *